(12) United States Patent
Kobayashi

(10) Patent No.: US 7,540,084 B2
(45) Date of Patent: Jun. 2, 2009

(54) METHOD FOR MANUFACTURING INK-JET HEADS

(75) Inventor: Kazuo Kobayashi, Kakamigahara (JP)

(73) Assignee: Brother Kogyo Kabushiki Kaisha (JP)

( * ) Notice: Subject to any disclaimer, the term of this patent is extended or adjusted under 35 U.S.C. 154(b) by 482 days.

(21) Appl. No.: 11/237,719

(22) Filed: Sep. 29, 2005

(65) Prior Publication Data

US 2006/0065701 A1    Mar. 30, 2006

(30) Foreign Application Priority Data

Sep. 30, 2004    (JP)    ............... 2004-287884

(51) Int. Cl.
*B21D 53/00*    (2006.01)
(52) U.S. Cl. ............... 29/890.1; 29/25.35; 156/252; 156/292; 347/68; 347/70; 347/71
(58) Field of Classification Search ............... 29/25.35, 29/890.1; 347/68, 70, 71; 156/252, 292
See application file for complete search history.

(56) References Cited

U.S. PATENT DOCUMENTS 4,392,145 A  *  7/1983  Parkola ............... 347/71
5,786,833 A  *  7/1998  Naka et al. ............... 347/71
6,354,898 B2 *  3/2002  Kim ............... 445/24
6,796,639 B2 *  9/2004  Sugahara ............... 347/71
7,076,873 B2 *  7/2006  Sugahara et al. ............ 29/890.1
2004/0080585 A1    4/2004  Iriguchi

FOREIGN PATENT DOCUMENTS

JP    10-250072    9/1998
JP    2004-136462    5/2004

* cited by examiner

*Primary Examiner*—Paul D Kim
(74) *Attorney, Agent, or Firm*—Banner & Witcoff, Ltd.

(57) ABSTRACT

A method for manufacturing a plurality of ink-jet heads comprising: forming an insulating ceramic layer at least on one of outermost metal plates of a plurality of metal plates, the outermost metal plates forming outermost layers of a laminate, the plurality of metal plates forming a metal plate set; stacking a plurality of metal plate sets via the insulating ceramic layer of each set; and heating the stacked plurality of metal plate sets and simultaneously diffusion bonding the plurality of metal plates in each set of the plurality of metal plate sets. A plurality of laminates can be manufactured at once by diffusion bonding the metal plates of the plurality of metal plate sets all together, without any diffusion bonding between two metal plates respectively belonging to different metal plate sets.

11 Claims, 24 Drawing Sheets

METHOD FOR MANUFACTURING INK-JET
HEADS

BACKGROUND OF THE INVENTION

1. Field of the Invention

The present invention relates to a method for manufacturing a laminate by diffusion bonding a plurality of stacked metal plates, and to a method for manufacturing an ink-jet head.

2. Description of the Related Art

Metal diffusion bonding (hereinafter referred to as diffusion bonding), in which a plurality of stacked metal plates are joined by heating these metal plates under pressure, is generally used in many different fields. For example, U.S. Patent Application Publication No. US2004/0080585A1 (corresponding to Japanese Patent Application Laid-open No. 2004-136462, FIGS. 1 to 5) discloses that a channel unit of an ink-jet head having an ink channel in its interior is manufactured by bonding a plurality of stacked plates by diffusion bonding.

SUMMARY OF THE INVENTION

A manufacturer of ink-jet heads must be able to manufacture many (mass produce) laminates by diffusion bonding metal plate sets including a plurality of metal plates. In such situations, manufacturing efficiency is low and manufacturing cost is high if the laminates are manufactured one by one by subjecting metal plate sets to diffusion bonding one set at a time. Consequently, there is a need for a technique with which metal plate sets can be mass produced with diffusion bonding more efficiently.

It is an object of the present invention to provide a method for manufacturing a laminate, with which a plurality of laminates can be manufactured all at once by subjecting the metal plates in a plurality of metal plate sets to diffusion bonding all together, without allowing any diffusion bonding to occur between two metal plates belonging to different metal plate sets, and to provide a method for manufacturing an ink-jet head.

According to a first aspect of the present invention, there is provided a method for manufacturing a plurality of laminates by diffusion bonding metal plate sets each including a plurality of metal plates, the method comprising: a first step of forming an insulating ceramic layer on a surface of a metal plate which is included in the plurality of metal plates of each of the metal plate sets and which forms a predetermined surface of each of the laminates; a second step of stacking the plurality of metal plate sets via the insulating ceramic layer; and a third step of heating the stacked plurality of metal plate sets and simultaneously diffusion bonding the plurality of metal plates belonging to the plurality of metal plate sets.

When a plurality of metal plate sets are stacked together and directly subjected to diffusion bonding in an effort to manufacture a plurality of laminates at the same time, unwanted bonding ends up occurring between the two metal plates respectively belonging to different metal plate sets as well. It is therefore necessary to somehow prevent diffusion bonding between two metal plates belonging to different metal plate sets, such as by stacking a plurality of metal plate sets with separator plates or the like interposed between the two metal plates belonging to different metal plate sets. In this case, the plates for preventing diffusion bonding have to be readied separately, and an extra step is needed for these plates to be interposed between the plurality of metal plate sets, which results in increasing the manufacturing cost. In view of this, the method of the present invention for manufacturing laminates is used in the manufacture of a plurality of laminates by the diffusion bonding of metal plate sets having a plurality of metal plates. In the method of the present invention, an insulating ceramic layer is formed on the surface of one of the metal plates in each metal plate set (first step), a plurality of the metal plate sets are stacked via the insulating ceramic layer (second step), and the stacked plurality of metal plate sets are all subjected to diffusion bonding at the same time (third step). Accordingly, a plurality of laminates can be manufactured at once, which shortens the manufacturing process. Also, since the diffusion of atoms in a ceramic material is much slower than the diffusion of atoms in a metal, when the plurality of metal plates belonging to a given metal plate set are bonded, the diffusion does not proceed so much between the insulating ceramic layer and the metal plates and thus it does not result in the bonding of the insulating ceramic layer and the metal plates. Therefore, when the plates are stacked with insulating ceramic layers interposed in between, the diffusion of atoms can be suppressed between the two metal plates each belonging to different metal plate sets, so there is no need to interpose a plate for preventing diffusion bonding between the plurality of metal plate sets prior to diffusion bonding. Accordingly, with the method of the present invention for manufacturing laminates, the plurality of metal plates each belonging to the plurality of metal plate sets may be simultaneously bonded by performing diffusion bonding except for between two metal plates stacked via the insulating ceramic layer.

The term "insulating ceramic" used in this application means a ceramic having electrical insulating properties, and includes ceramics having other functions besides insulation, such as "piezoelectric ceramics" and "water-repellent ceramics". In particular, the ceramic materials listed in Tables 1 and 2 are included in "insulating ceramic".

In the method of the present invention for manufacturing laminates, in the first step, the insulating ceramic layer may be formed by aerosol deposition in which a powder of an insulating ceramic material is deposited by being sprayed onto the predetermined surface of each of the laminates. This allows the insulating ceramic layer to be formed more easily.

In the method of the present invention for manufacturing laminates, each of the laminates is a metal substrate on which electronic components are mounted, and the insulating ceramic layer insulates the metal substrate from wiring connected to the electronic components. When the laminate including the plurality of metal plates is a metal substrate on which electronic components are mounted, the insulating ceramic layer can insulate between the wiring and the metal substrate when the wiring is formed on the surface of the insulating ceramic layer formed for diffusion bonding in the first step.

In the method of the present invention for manufacturing laminates, prior to the second step, a hole or groove through which a liquid flows may be formed in at least one of the plurality of metal plates belonging to each of the metal plate sets. Therefore, any heat generated in the electronic component will be conducted from the insulating ceramic layer to the metal plates, and further conducted to the liquid flowing through the hole or groove formed in at least one of the metal plates. Since this heat is transferred away from the electronic component by the liquid, heat can be diffused more efficiently.

According to a second aspect of the present invention, there is provided a method for manufacturing a plurality of ink-jet heads each of which includes a channel unit having a laminate of a plurality of metal plates, the laminate forming an ink channel which includes a plurality of pressure chambers communicating with nozzles, and a piezoelectric actuator which varies a volume of the pressure chambers, the method comprising: an insulating ceramic layer formation step of forming an insulating ceramic layer on at least one of outermost metal plates of the plurality of metal plates, the outermost metal plates forming outermost layers of the laminate; a stacking step of stacking a plurality of metal plate sets each of which includes the plurality of metal plates forming the laminate, via the insulating ceramic layer; and a bonding step of heating the stacked plurality of metal plate sets and simultaneously diffusion bonding the plurality of metal plates belonging to each of the plurality of metal plate sets.

In this method for manufacturing ink-jet heads, an insulating ceramic layer is formed on the outermost metal plate in a metal plate set having a plurality of metal plates in laminar form and forming a channel unit (insulating ceramic layer formation step), a plurality of metal plate sets are stacked via the insulating ceramic layer (stacking step), and the stacked plurality of metal plate sets are all subjected to diffusion bonding at the same time (bonding step). Accordingly, a plurality of laminates each having a channel unit may be manufactured all at once, which shortens the manufacturing process. Specifically, with the method of the present invention for manufacturing ink-jet heads, in the bonding step, a plurality of metal plates may be bonded simultaneously by diffusion bonding except for between the metal plates stacked via the insulating ceramic layer. Here, since the two metal plates stacked via the insulating ceramic layer do not undergo diffusion bonding, there is no need to interpose a plate or the like for preventing diffusion bonding between a plurality of metal plate sets prior to the diffusion bonding.

In the method of the present invention for manufacturing ink-jet heads, one of the outermost metal plates may be a vibration plate which covers the pressure chambers, and each of the ink-jet heads may have a piezoelectric layer disposed on a side of the vibration plate opposite to the pressure chambers. In this case, since metal plate sets each including the vibration plate are stacked via the insulating ceramic layer formed on one side of the vibration plate, the vibration plate can be bonded simultaneously during diffusion bonding, which shortens the manufacturing process.

The method of the present invention for manufacturing ink-jet heads may further comprise an individual electrode formation step of forming a plurality of individual electrodes on a side of the insulating ceramic layer opposite to the pressure chambers at positions facing each of the plurality of pressure chambers; a piezoelectric layer formation step of forming a piezoelectric layer on the side of the insulating ceramic layer on which the individual electrodes are formed; and a common electrode formation step of forming a common electrode on a side of the piezoelectric layer opposite to the individual electrodes. Therefore, by forming individual electrodes on the surface of the insulating ceramic layer formed for the purpose of diffusion bonding in the insulating ceramic layer formation step, the insulating ceramic layer can insulate between individual electrodes and the metal vibration plate.

In the method of the present invention for manufacturing ink-jet heads, one of the outermost metal plates may be a nozzle plate. When the nozzle plate is made of metal, the nozzle plate can be simultaneously bonded during diffusion bonding, so the manufacturing process can be shortened. Also, when a water repellent ceramic layer such as water repellent zirconia is provided to the surface of the nozzle plate, diffusion bonding will be possible via this water repellent ceramic.

In the method of the present invention for manufacturing ink-jet heads, the outermost metal plates may be a vibration plate and a nozzle plate. In this case, since the insulating ceramic layer is formed on both the vibration plate and the nozzle plate, when a plurality of metal plate sets are stacked, the diffusion bonding pertaining to the present invention can be accomplished regardless of the orientation of the various metal plate sets, which makes the lamination process even simpler.

In the method of the present invention for manufacturing ink-jet heads, the insulating ceramic layer may be formed of alumina or zirconia, which have excellent insulating properties.

In the method of the present invention for manufacturing ink-jet heads, the piezoelectric actuator may have a piezoelectric layer, and the insulating ceramic layer may be the piezoelectric layer. In this case, since a plurality of metal plate sets are stacked via the piezoelectric layer, the piezoelectric layer will have not only its original function as a piezoelectric actuator, but will also function to prevent the bonding of the plurality of metal plate sets during diffusion bonding. This allows the ink-jet head manufacturing process to be shortened. In particular, a piezoelectric layer usually requires sintering and annealing steps, but since the metal plate sets are heated in the course of the bonding step with the present invention, the piezoelectric layer is also sintered and annealed. Accordingly, the steps of sintering and annealing the piezoelectric layer can be omitted, which shortens the manufacturing process and also conserves energy.

In the method of the present invention for manufacturing ink-jet heads, the vibration plate may be a common electrode. In this case, the step of forming a common electrode can be omitted.

In the method of the present invention for manufacturing ink-jet heads, the other of the outermost metal plates may be a vibration plate, and the bonding step may be followed by a step of forming an insulating ceramic layer by one of aerosol deposition, sol-gel method, and sputtering on one surface of the vibration plate. Particularly when the insulating ceramic layer is a piezoelectric layer, the annealing of the piezoelectric layer can be performed at the optimal temperature and duration according to the thickness of the piezoelectric layer.

BRIEF DESCRIPTION OF THE DRAWINGS

FIG. 19 is a diagram showing the step of forming a water repellent ceramic layer on a nozzle plate 13a;

DESCRIPTION OF THE PREFERRED EMBODIMENTS

First Embodiment

A first embodiment of the present invention will be described. This first embodiment is an example of applying the present invention to the manufacture of an ink-jet head that discharges ink.

Figure 1:
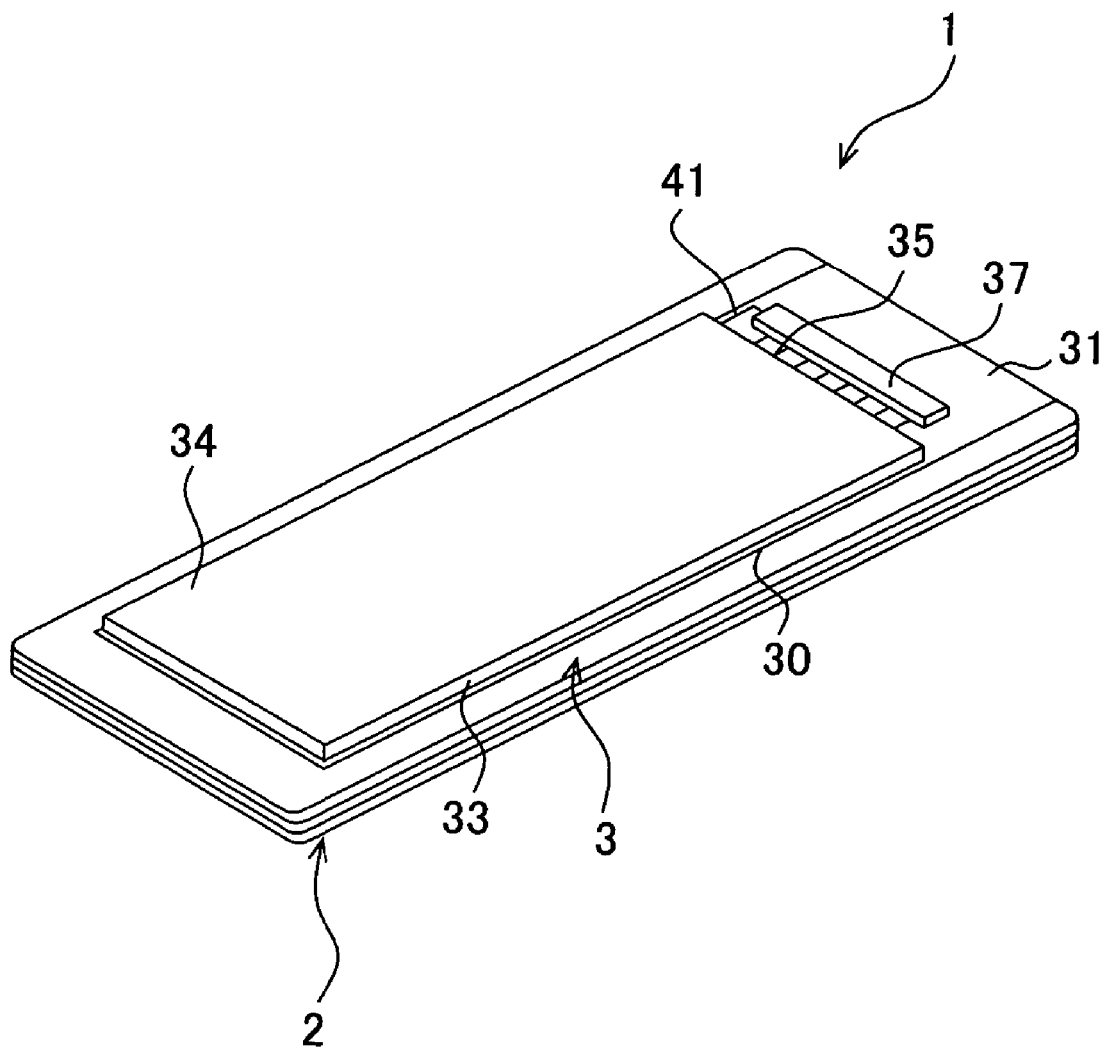
FIG. 1 is a perspective view of an ink-jet head according to a first embodiment of the present invention.

First, an ink-jet head 1 will be described through reference to FIGS. 1 to 4. The vertical direction in this description is defined as the vertical direction in the sheet surface of FIG. 1. As shown in FIG. 1, the ink-jet head 1 includes a channel unit 2 which is rectangular in plan view and has an ink channel formed in its interior, and a piezoelectric actuator 3 which is stacked on the top surface of this channel unit 2.

Figure 2:
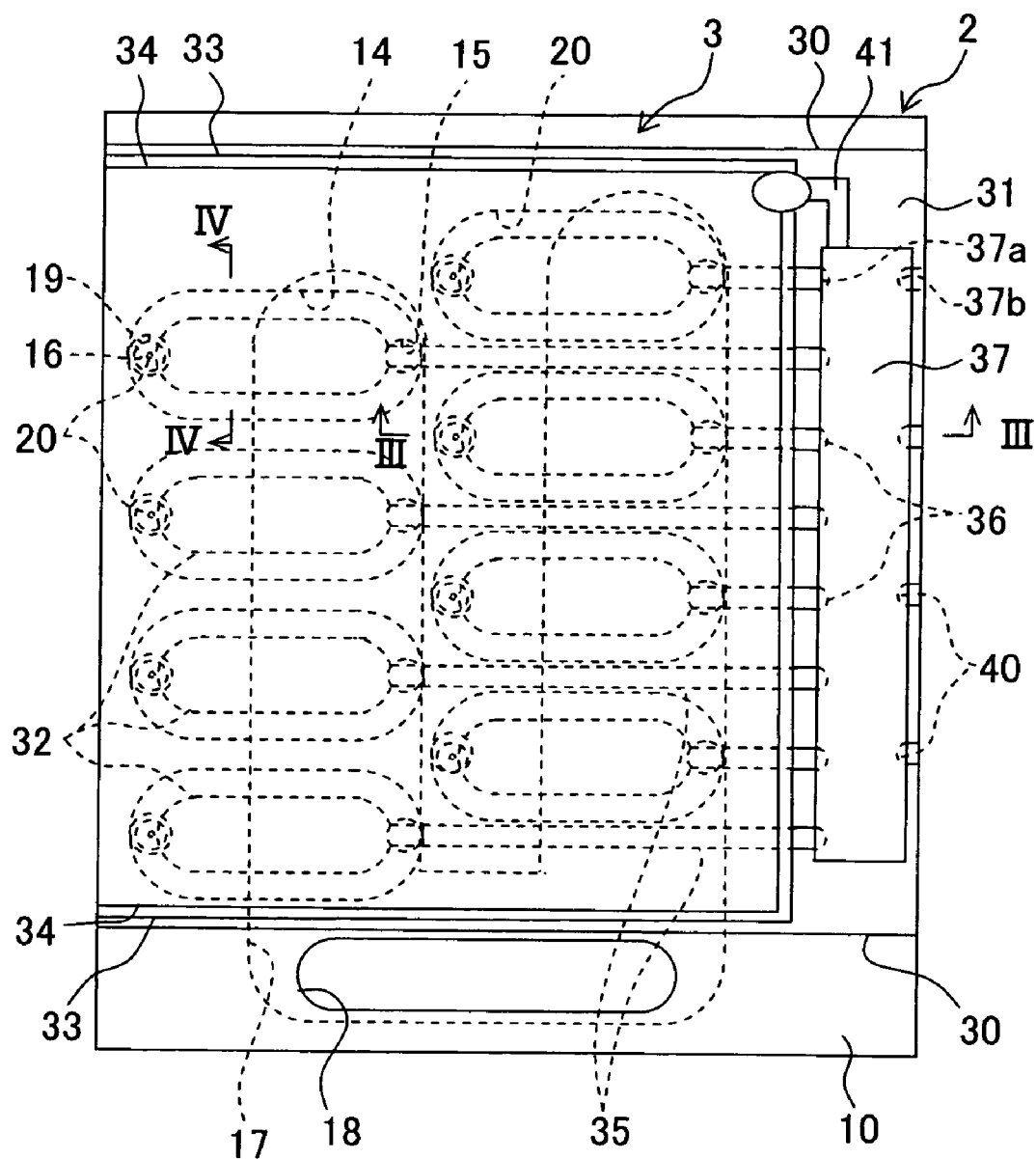
FIG. 2 is a plan view of the right half of the ink-jet head in FIG. 1.
Figure 3:
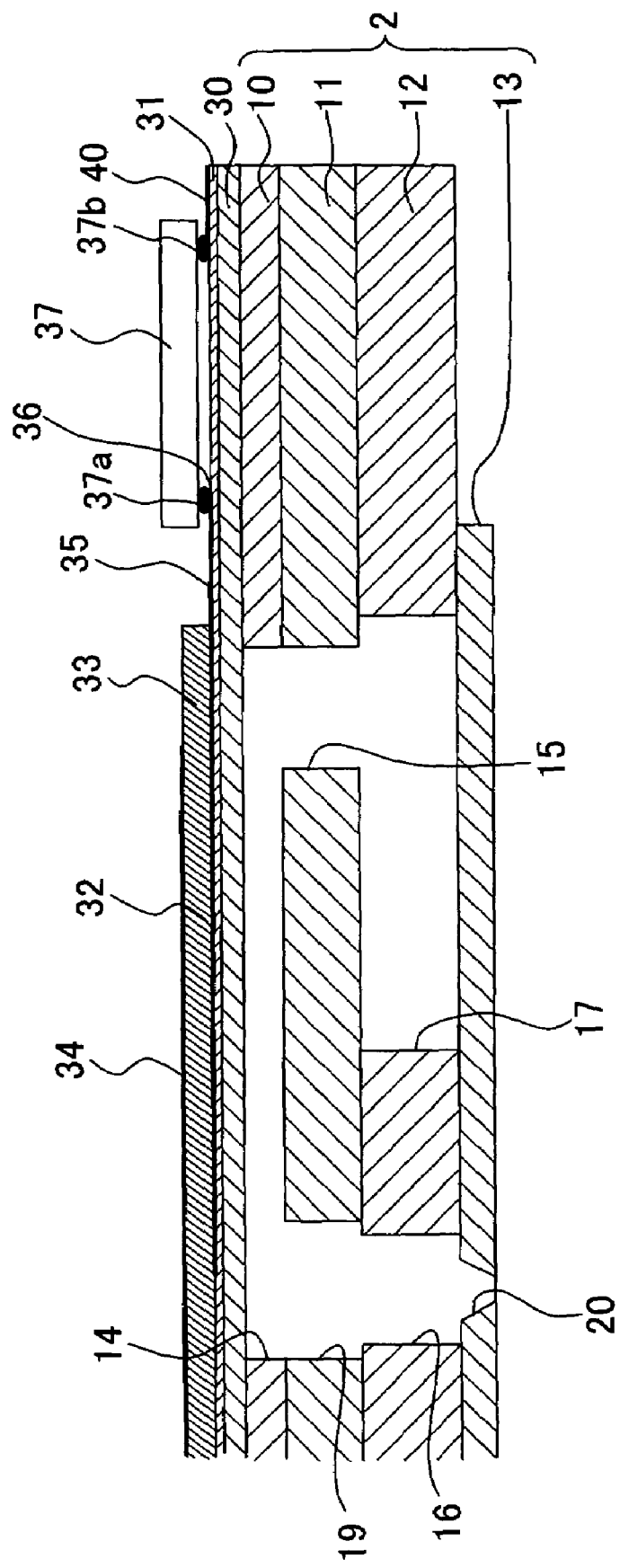
FIG. 3 is a cross section taken along the III-III line in FIG. 2.
Figure 4:
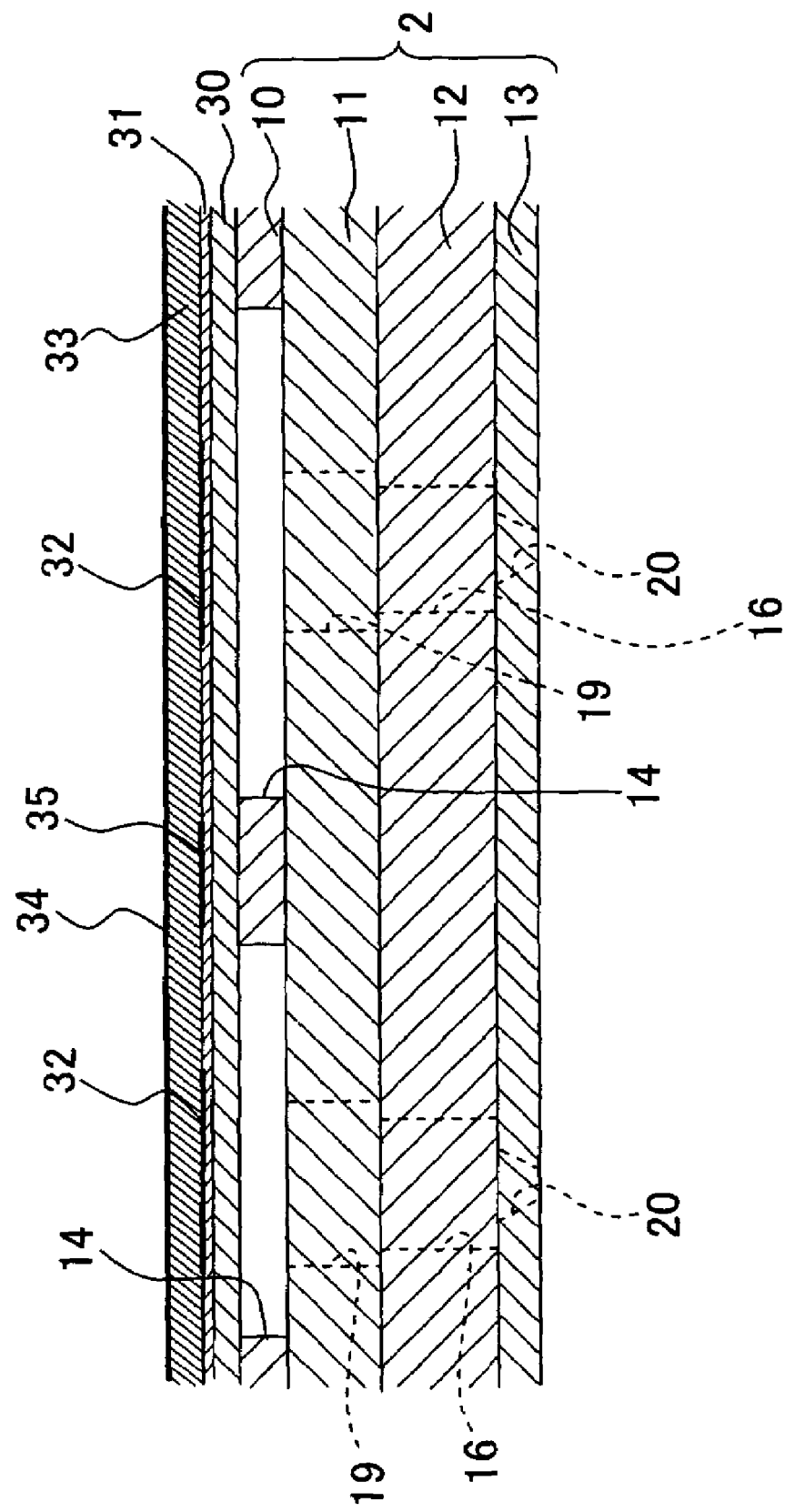
FIG. 4 is a cross section taken along the IV-IV line in FIG. 2.

As shown in FIGS. 2 to 4, the channel unit 2 includes a cavity plate 10, a base plate 11, a manifold plate 12, and a nozzle plate 13, and these four plates 10 to 13 are bonded in a stacked state. Of these, the cavity plate 10, the base plate 11, and the manifold plate 12 are substantially rectangular plates made of metal (such as stainless steel), and these three plates 10 to 12 are provided with holes for forming an ink channel which includes a manifold 17, pressure chambers 14, and so forth (discussed below). These holes can be easily formed by etching since the plates 10 to 12 are made of metal. The nozzle plate 13 is formed, for example, from a polyimide or other synthetic high-molecular resin material, and is bonded to the underside of the manifold plate 12.

As shown in FIG. 2, a plurality of pressure chambers 14 arranged in a plane are formed in the cavity plate 10 (pressure chamber formation plate). These pressure chambers 14 open onto the surface of the channel unit 2 (the upper surface of the cavity plate 10 to which a vibration plate 30 (discussed below) is bonded). FIG. 2 shows a part (eight) of the plurality of pressure chambers 14. Each of the pressure chambers 14 is formed in a substantially elliptical shape in plan view, with the major axis direction thereof disposed parallel to the longitudinal direction of the cavity plate 10.

Communicating holes 15 and 16 are formed at positions overlapping the ends of the pressure chambers 14 in the major axis direction thereof as seen in a plan view of the base plate 11. The manifold 17 is formed in the manifold plate 12, the manifold 17 extending in two rows in the short direction (the vertical direction in FIG. 2) thereof, and overlapping the right half of the pressure chambers 14 as seen in the plan view of FIG. 2. Ink is supplied to this manifold 17 from an ink tank (not shown) through an ink supply port 18 formed in the cavity plate 10. Communicating holes 19 are also formed at positions overlapping the left end of the pressure chambers 14 as seen in the plan view of FIG. 2. In addition, a plurality of nozzles 20 are formed in the nozzle plate 13 at positions overlapping the left ends of the pressure chambers 14 as seen in the plan view of FIG. 2. The nozzles 20 are formed, for example, by subjecting a substrate of polyimide or another synthetic high-molecular resin material to excimer laser processing.

As shown in FIG. 3, the manifold 17 communicates with the pressure chambers 14 through the communicating holes 15, and the pressure chambers 14 communicate with the nozzles 20 through the communicating holes 16 and 19. Thus, individual ink channels extending from the manifold 17, through the pressure chambers 14, to the nozzles 20 are formed inside the channel unit 2.

The piezoelectric actuator 3 will now be described. As shown in FIGS. 1 to 4, the piezoelectric actuator 3 includes a vibration plate 30 disposed on the top surface of the channel unit 2 so as to cover the plurality of pressure chambers 14, an insulating ceramic layer 31 formed on the top surface of this vibration plate 30, a plurality of individual electrodes 32 formed on the top surface of the insulating ceramic layer 31 at positions facing the each of the plurality of pressure chambers 14, a piezoelectric layer 33 formed on the top surface of the insulating ceramic layer 31, and a common electrode 34 formed on the top surface of this piezoelectric layer 33. As discussed above, the vibration plate 30 covers the pressure chambers 14 and defines the channel of the channel unit 2, so the vibration plate 30 may be considered part of the channel unit 2.

The vibration plate 30 is a plate made of metal (such as stainless steel) which is substantially rectangular in plan view, and this vibration plate 30 is stacked on and bonded to the top surface of the cavity plate 10 so as to cover the plurality of pressure chambers 14. The insulating ceramic layer 31, which is composed of a ceramic material with high insulating resistance, such as alumina, is formed on the surface of this vibration plate 30. Table 1 lists examples of ceramic materials which can be used to form this insulating ceramic layer 31, and the volumetric resistance values thereof. The material of the insulating ceramic layer in the present invention is not limited to the materials listed in Table 1, but alumina and zirconia are examples of materials that can be used favorably for the insulating ceramic layer of the ink-jet head of the present invention.

TABLE 1

| Ceramic material | Volumetric resistance (Ω · cm) |
| --- | --- |
| alumina | $>1 \times 10^{14}$ |
| zirconia | $>1 \times 10^{14}$ |
| silica | $>1 \times 10^{14}$ |
| mullite | $>1 \times 10^{14}$ |
| cordierite | $>1 \times 10^{14}$ |
| steatite | $>1 \times 10^{14}$ |
| forsterite | $>1 \times 10^{14}$ |
| yttria | $>1 \times 10^{14}$ |
| silicon nitride | $>1 \times 10^{14}$ |
| aluminum nitride | $>1 \times 10^{14}$ |
| PZT | $>1 \times 10^{11}$ |

This insulating ceramic layer 31, as discussed below, is formed for the purpose of bundling together and diffusion-bonding a plurality of sets each including four metal plates (the cavity plate 10, the base plate 11, the manifold plate 12, and the vibration plate 30) and constructing the ink-jet head 1, but also serves to electrically insulate the vibration plate 30 from wires 35 and the individual electrodes 32 (discussed next) formed above the upper side of the vibration plate 30. The ceramic material forming the insulating ceramic layer 31 is preferably one with a high modulus of elasticity, in which case the piezoelectric actuator 3 will have higher rigidity and responsiveness will be improved.

A plurality of individual electrodes 32 that are elliptical in plan view and are smaller in size than the pressure chambers 14 to a certain extent are formed on the surface of the insulating ceramic layer 31. The individual electrodes 32 are formed at positions overlapping the center parts of the corresponding pressure chambers 14 as seen in plan view. The individual electrodes 32 are formed of a conductive material such as gold. The individual electrodes 32 are electrically insulated from the metal (that is, conductive) vibration plate 30 and other adjacent individual electrodes 32 by the insulating ceramic layer 31.

A plurality of wires 35 extend parallel to the major axis direction of the individual electrodes 32 from one end of the plurality of individual electrodes 32 (the right end in FIG. 2) on the upper surface of the insulating ceramic layer 31, and a terminal 36 is formed at the end of each of these wires 35. Similar to the individual electrodes 32 discussed above, the wires 35 are electrically insulated from the vibration plate 30 and other adjacent wires 35 by the insulating ceramic layer 31. Output terminals 37a of a driver IC 37 that selectively supply drive voltage to the plurality of individual electrodes 32 are joined, via bumps of solder or other such conductive brazing filler material, to the plurality of terminals 36 corresponding to the plurality of individual electrodes 32. The driver IC 37 is disposed on the upper surface of the insulating ceramic layer 31. Thus, the plurality of individual electrodes 32 and the driver IC 37 can be directly connected by the wires 35 formed in the same plane as the individual electrodes 32, without interposing any costly wiring members such as a flexible printed circuit (FPC), so the cost of electrically connecting the individual electrodes 32 and the driver IC 37 is reduced, and the reliability of these electrical connections is higher.

Further, a plurality of connection terminals 40 to be joined to input terminals 37b of the driver IC 37 are formed on the insulating ceramic layer 31. The driver IC 37 and a control unit (not shown) which controls this driver IC 37 can be easily connected via the connection terminals 40 by joining these connection terminals 40 and the input terminals 37b of the driver IC 37 via bumps of solder or the like.

The piezoelectric layer 33, whose main component is lead zirconate titanate (PZT), which is a ferroelectric substance and is a solid solution of lead titanate and lead zirconate, is formed on the surface of the plurality of individual electrodes 32. This piezoelectric layer 33 is formed as a single layer which is contiguous over all of the individual electrodes 32, so as to cover the entire surface of the plurality of individual electrodes 32. The common electrode 34, which is common to the plurality of individual electrodes 32, is formed over the upper surface of the piezoelectric layer 33. This common electrode 34 is also formed of a conductive material such as gold, similar to the individual electrodes 32. As shown in FIG. 2, a single wire 41 extends from the common electrode 34 over the upper surface the piezoelectric layer 33 and over the upper surface of the insulating ceramic layer 31, and this wire 41 is electrically connected to a terminal (not shown) of the driver IC 37. The common electrode 34 is grounded through the wire 41 and the driver IC 37, and is maintained at ground potential.

The operation of the piezoelectric actuator 3 during ink discharge will now be described. When drive voltage is selectively supplied from the driver IC 37 through the wires 35 to the individual electrodes 32, the individual electrodes 32 on the lower side of the piezoelectric layer 33 to which the drive voltage is supplied are in a different potential state from that of the common electrode 34 on the upper side of the piezoelectric layer 33 maintained at ground potential, generating a vertical electrical field in the piezoelectric layer 33 sandwiched between the electrodes 32 and 34. At this point, the portion of the piezoelectric layer 33 which is directly over the individual electrodes 32 to which drive voltage has been applied contracts horizontally (perpendicular to the vertical direction, which is the direction of polarization). Since the vibration plate 30 on the lower side of the piezoelectric layer 33 is fixed to the cavity plate 10, the portion of the piezoelectric layer 33 sandwiched between the electrodes 32 and 34 deforms so as to project toward the pressure chambers 14, and this partial deformation of the piezoelectric layer 33 is accompanied by deformation of the portion of the vibration plate 30 covering the pressure chambers 14, so as to project toward the pressure chambers 14. At this point, there is a reduction in the volume inside the pressure chambers 14, so the ink pressure rises and the ink is discharged from the nozzles 20 communicating with the pressure chambers 14.

Figure 5:
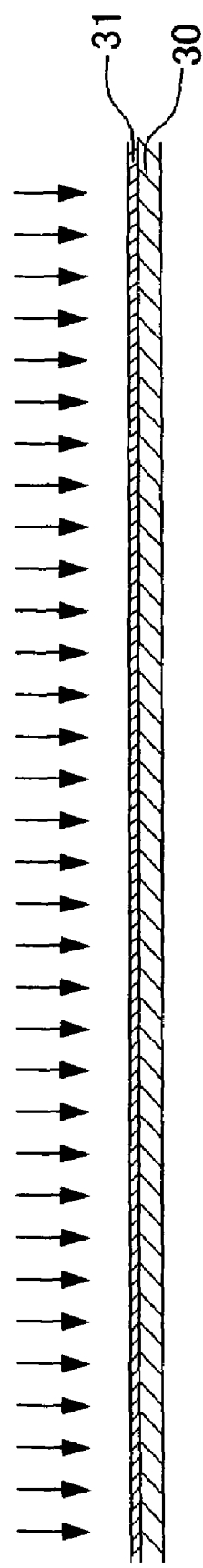
FIG. 5 is a diagram showing the insulating ceramic layer formation step.

Next, the method for manufacturing the ink-jet head 1 described above will now be described. As shown in FIG. 5, first, the insulating ceramic layer 31 is formed on one surface of the vibration plate 30 (insulating ceramic layer formation step). Here, the insulating ceramic layer 31 can be easily formed by employing aerosol deposition (AD) method, in which a powder of an insulating ceramic material is deposited by being sprayed toward a predetermined surface of the vibration plate 30. The insulating ceramic layer 31 may also be formed by sol-gel method, sputtering method, or another such method.

Figure 6:
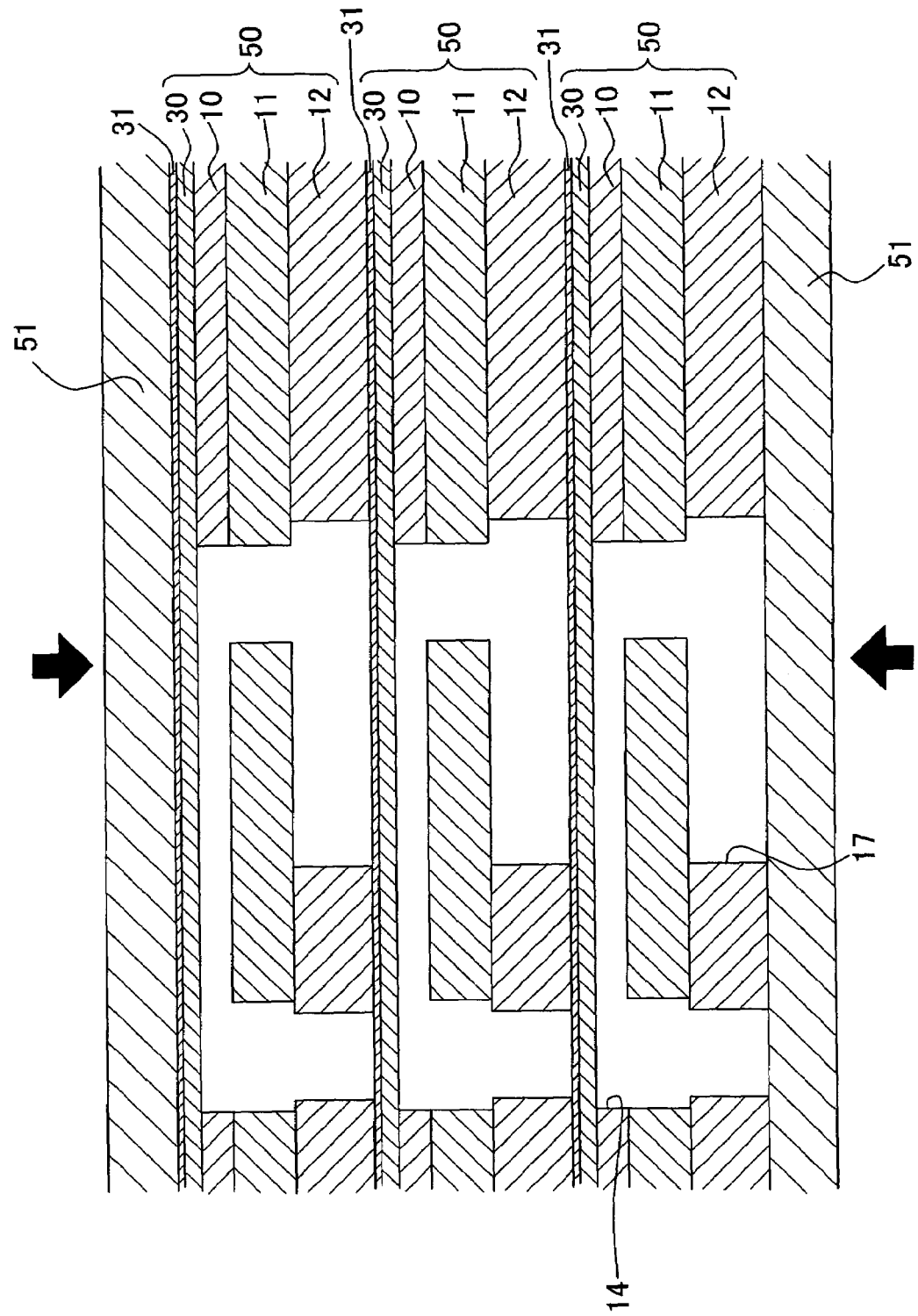
FIG. 6 is a diagram showing the stacking step and bonding step in the first embodiment.

Next, as shown in FIG. 6, the cavity plate 10, the base plate 11, and the manifold plate 12 constructing the channel unit 2, and having holes for forming an ink channel provided therein, and the vibration plate 30 are stacked so that a surface of the vibration plate 30, opposite to the surface on which the insulating ceramic layer 31 is formed, makes contact with the upper surface of the cavity plate 10. A plurality of (such as three) plate sets 50 each including these four metal plates are stacked via the insulating ceramic layer 31, and the manifold plate 12 of one plate set 50 is stacked to the surface of the insulating ceramic layer 31 formed on the vibration plate 30 belonging to another plate set 50 (stacking step).

The plurality of stacked plate sets 50 are clamped in a jig 51 in the form of a pair of upper and lower plates, and the plate sets 50 are heated to about 1000° C. while being pressed through the jig 51, thereby bonding the four plates (the cavity plate 10, the base plate 11, the manifold plate 12 and the vibration plate 30) belonging to each of the plate sets 50 by diffusion bonding (bonding step). The region of the jig 51 where pressure can be applied uniformly by clamping between the upper and lower plates is called the joining workspace, and is usually a few dozen centimeters in width, depth, and height. In contrast, the size of the channel unit of the ink-jet head is usually about a few dozen centimeters square, and the thickness is about a few millimeters. Therefore, a plurality of plate sets or a module combining a plurality of plate sets can be arranged simultaneously in a plane within the joining workspace of the jig 51, and these can be further stacked in laminar form. This allows a large quantity of plate sets to be diffusion-bonded at the same time. Thus, a plurality of the plate sets 50 are subjected to diffusion bonding in a state in which the plate sets 50 are stacked with an insulating ceramic layer 31 in between every two sets. In this case, since the diffusion of atoms in a ceramic material is far slower than the diffusion of atoms in a metal. Accordingly, when the four plates belonging to a given plate set 50 are bonded, diffusion between the insulating ceramic layer 31 of this plate set 50 and the manifold plate 12 of another plate set 50 does not proceed to the extent that the insulating ceramic layer 31 and the manifold plate 12 would be bonded. Therefore, when the heating and pressure provided by the jig 51 are concluded as soon as the four plates belonging to a given plate set 50 have been bonded, there will be no bonding of the two plates (the vibration plate 30 and the manifold plate 12) respectively belonging to different plate sets 50 and stacked via the insulating ceramic layer 31.

Figure 7:
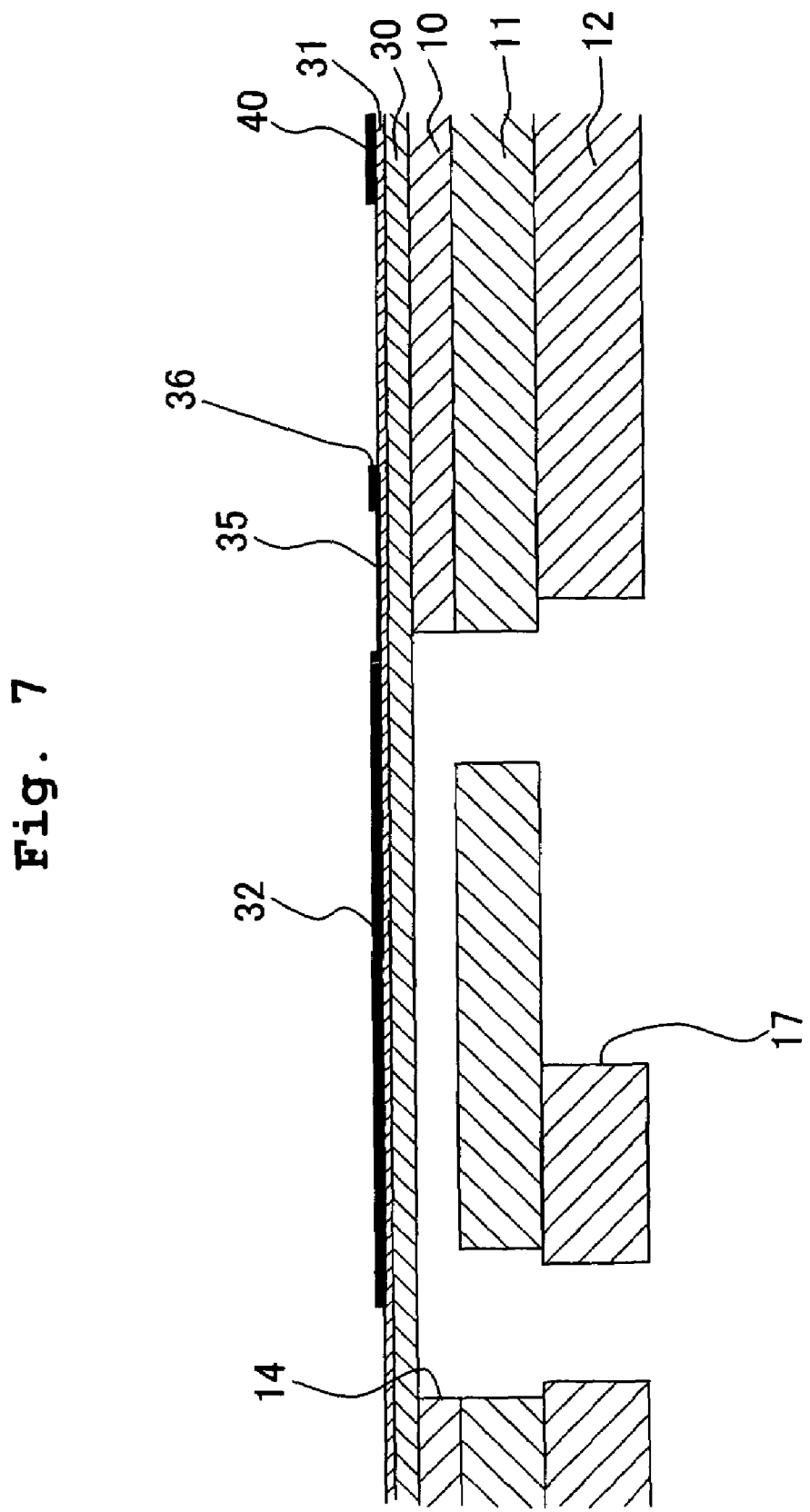
FIG. 7 is a diagram showing the individual electrode formation step.

Next, the individual electrodes 32, the piezoelectric layer 33, the common electrode 34, and so forth are successively formed on each of the plurality of laminates obtained by bonding the cavity plate 10, the base plate 11, the manifold plate 12, and the vibration plate 30 in the bonding step described above. Specifically, as shown in FIG. 7, the individual electrodes 32, the wires 35, the terminals 36, and the connection terminals 40 are formed on the surface of the insulating ceramic layer 31 (individual electrode formation step). Here, individual electrodes 32, wires 35, terminals 36, and connection terminals 40 which have been patterned, for example, by the screen printing of a conductive paste can be formed all at once on the surface of the insulating ceramic layer 31. Alternatively, a conductive layer may be formed over the entire surface of the insulating ceramic layer 31 by plating, sputtering, vapor deposition, or another such method, and then the conductive layer may be partially removed by using a laser, a mask, a resist, or the like to pattern the individual electrodes 32, the wires 35, the terminals 36, and the connection terminals 40.

Figure 8:
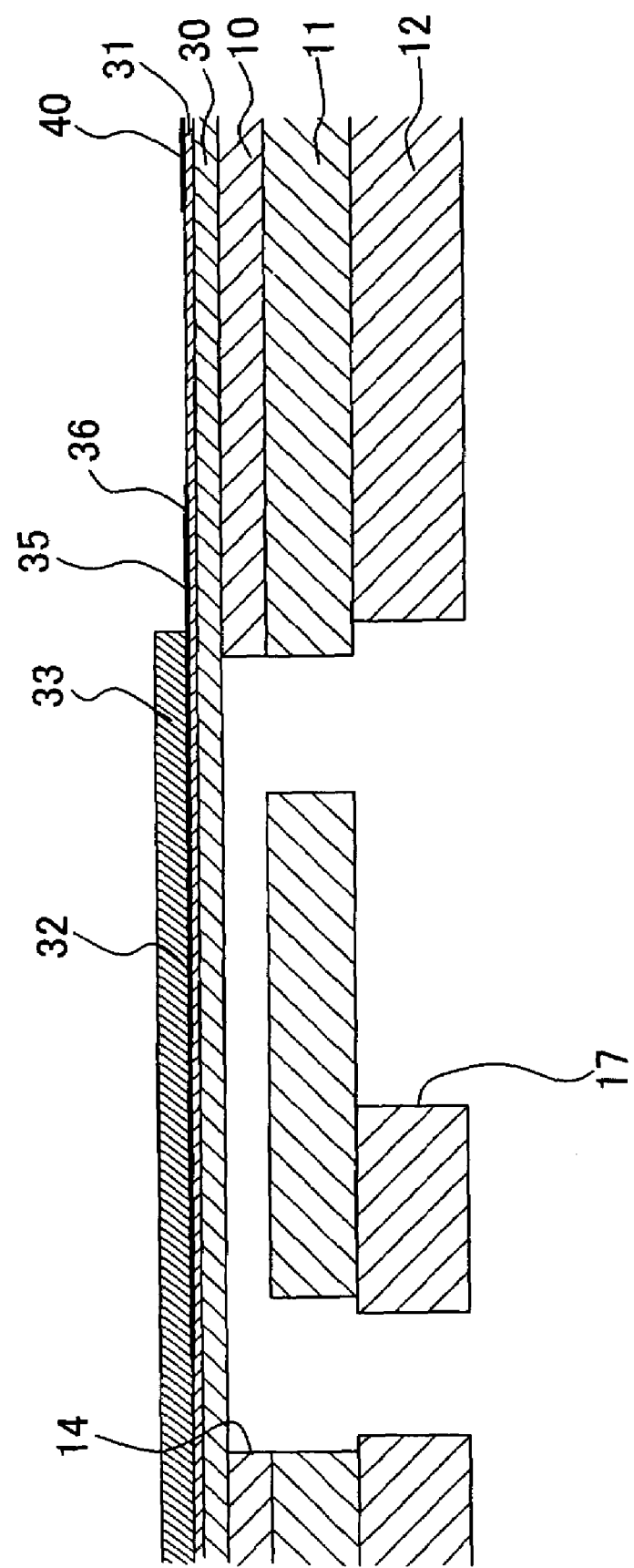
FIG. 8 is a diagram showing the piezoelectric layer formation step.
Figure 9:
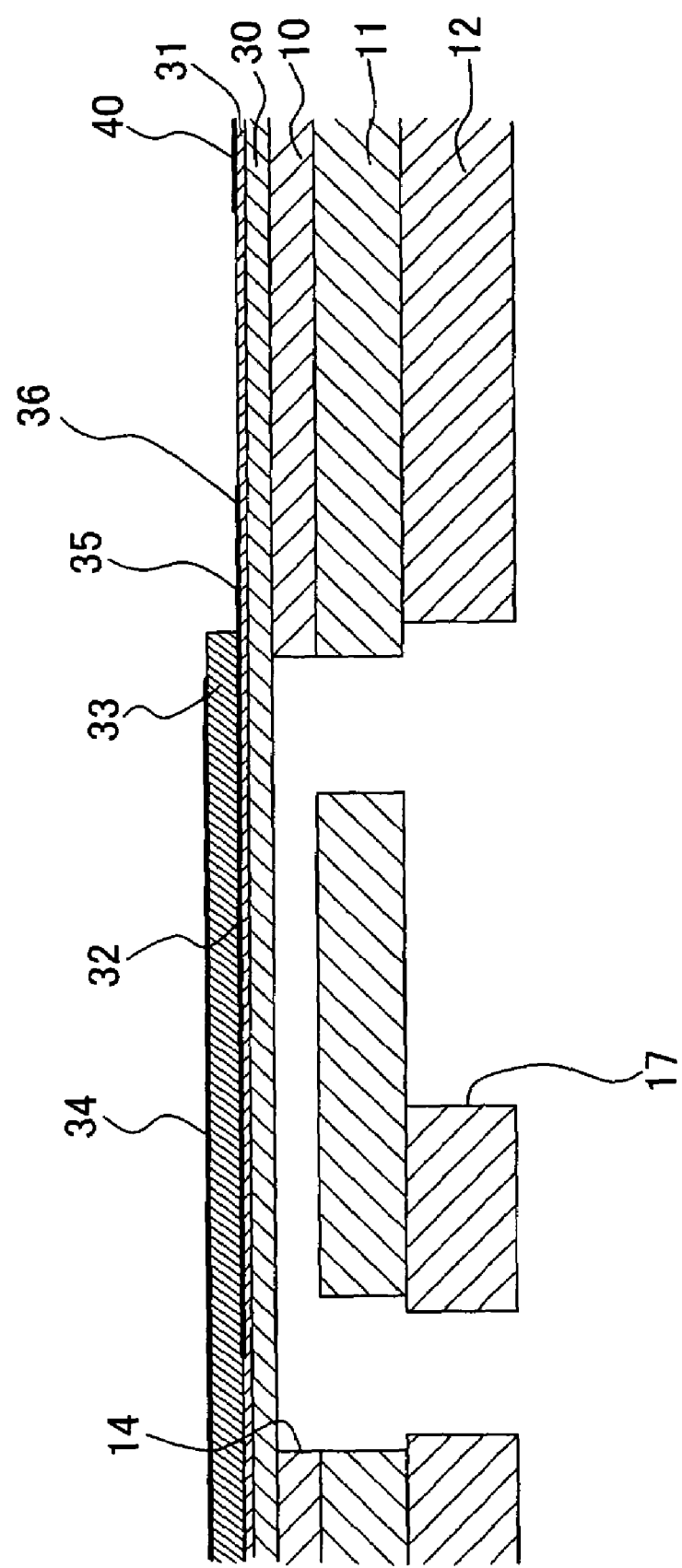
FIG. 9 is a diagram showing the common electrode formation step.

Next, as shown in FIG. 8, the piezoelectric layer 33 is formed by aerosol deposition, sol-gel method, sputtering, or another such method on the surface of the individual electrodes 32 (piezoelectric layer formation step), and a heat treatment is performed at about 600° C. to promote the crystal growth of the PZT of the piezoelectric layer 33. Further, as shown in FIG. 9, the common electrode 34 and the wire 41 (see FIG. 2) are formed by screen printing, vapor deposition, sputtering, or another such method on the surface of the piezoelectric layer 33 (common electrode formation step).

Figure 10:
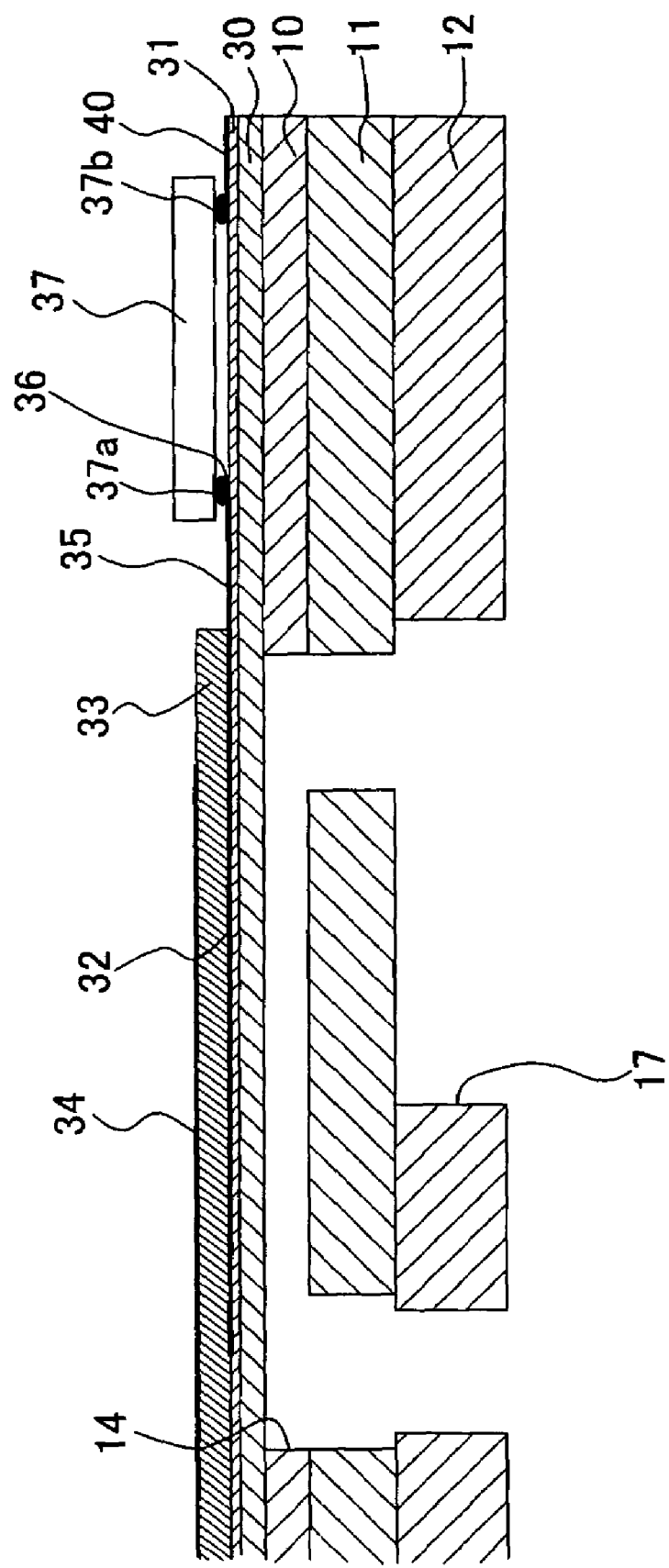
FIG. 10 is a diagram showing the step of disposing a driver IC on the insulating ceramic layer.
Figure 11:
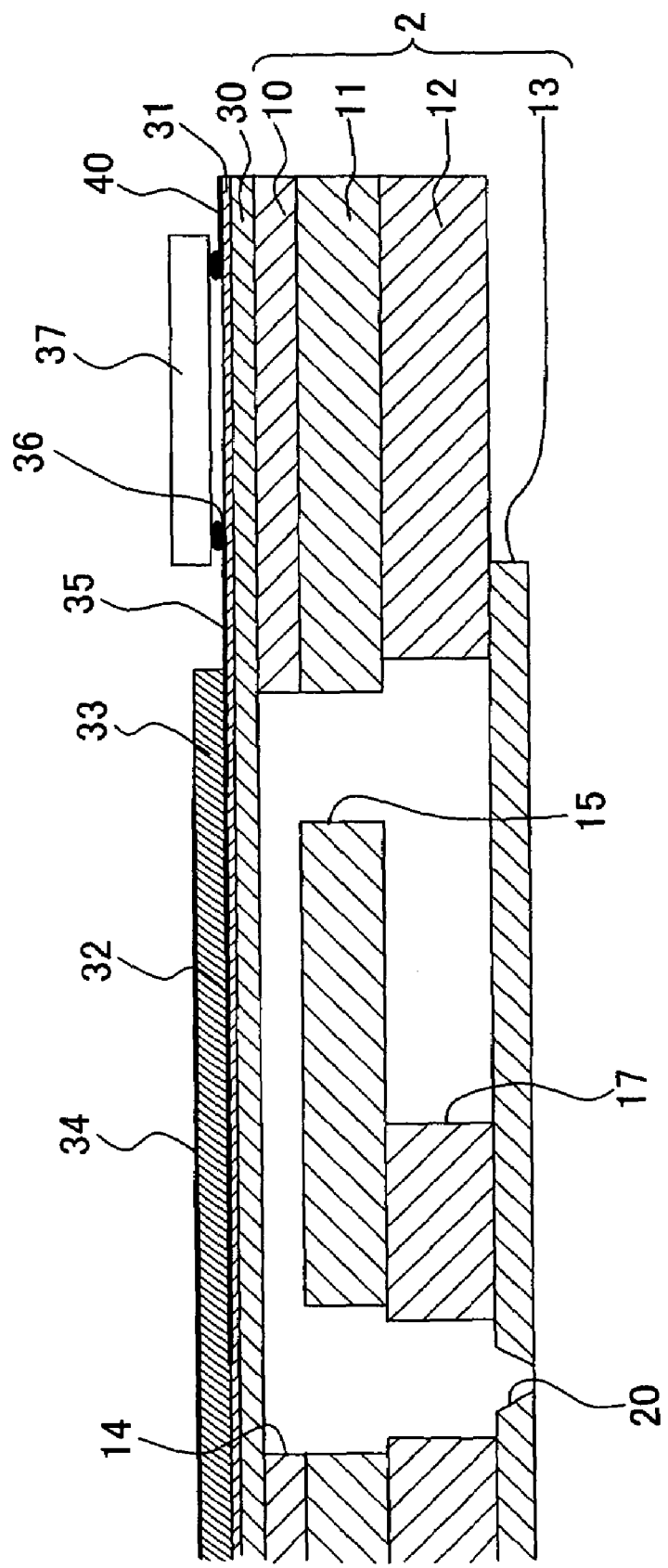
FIG. 11 is a diagram showing the step of bonding the nozzle plate.

Then, as shown in FIG. 10, the driver IC 37 is disposed on the insulating ceramic layer 31, the output terminals 37a of this driver IC 37 are joined to the terminals 36 of the wires 35, and the input terminals 37b of the driver IC 37 are joined to the connection terminals 40. Finally, as shown in FIG. 11, the nozzle plate 13 is bonded to the lower surface of the manifold plate 12.

When the nozzle plate 13 is formed of a synthetic high-molecular resin material with a low heat resistance temperature, such as a polyimide, as mentioned above, the nozzle plate 13 needs to be bonded to the manifold plate 12 after the four metal plates have been bonded by diffusion bonding, but when the nozzle plate 13 is formed from a metal material such as stainless steel, then the nozzle plate 13 can be bonded by diffusion bonding along with the cavity plate 10, the base plate 11, the manifold plate 12, and the vibration plate 30 in the bonding step in FIG. 6.

The following effects are obtained with the method for manufacturing the ink-jet head 1 described above. Because a plurality of plate sets 50 each including four metal plates (the cavity plate 10, the base plate 11, the manifold plate 12, and the vibration plate 30) are stacked via the insulating ceramic layer 31 formed on the vibration plate 30 of each of the plate sets, after which all of these plate sets 50 undergo diffusion bonding together, a plurality of laminates including a channel unit and a vibration plate 30 can be manufactured at the same time, which shortens the manufacturing process. Also, since the vibration plates 30 and the manifold plates 12 belonging to two different plate sets 50 are stacked with the insulating ceramic layer 31 interposed in between, the insulating ceramic layer 31 prevents these two plates from being bonded, so there is no need to interpose plates or the like for preventing diffusion bonding between the plate sets 50 prior to diffusion bonding.

Also, since a plurality of individual electrodes 32 and a plurality of wires 35 are formed on the surface of the insulating ceramic layer 31, which is formed to allow the plurality of plate sets 50 to be diffusion-bonded all at once, the insulating ceramic layer 31 electrically insulates the individual electrodes 32 and the wires 35 from the conductive vibration plate 30 and from other adjacent individual electrodes 32 and wires 35. Furthermore, the driver IC 37 is disposed on the surface of the insulating ceramic layer 31, which allows the individual electrodes 32 and the driver IC 37 to be directly connected by the wires 35 formed in the same plane as the individual electrodes 32, a wiring member such as an FPC can be omitted, which reduces the cost of manufacturing the ink-jet head 1.

Second Embodiment

Next, a second embodiment of the present invention will be described through reference to FIGS. 19 to 21. In this embodiment, a metal nozzle plate 13a is provided to the lower surface of the manifold plate 12, a water repellent ceramic layer 13b is formed as an insulating ceramic layer on one side thereof, and plate sets are stacked via the water repellent ceramic layer 13b and diffusion-bonded.

Figure 19:
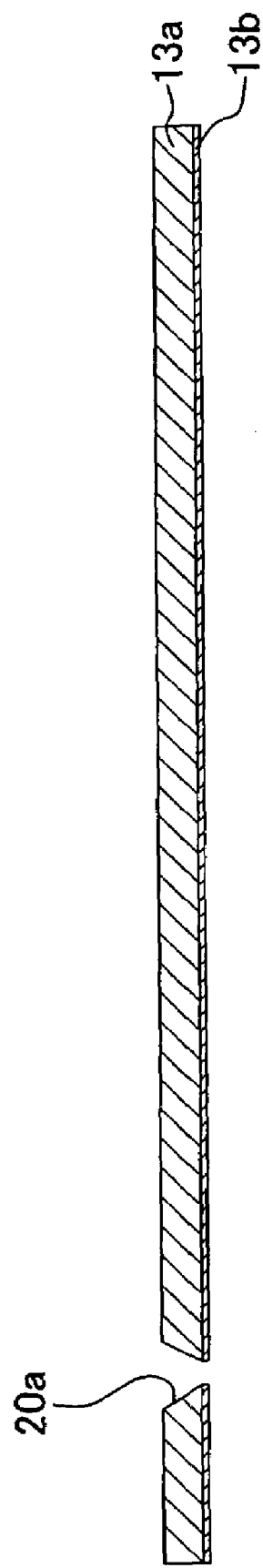

As shown in FIG. 19, the water repellent ceramic layer 13b, which is made of water repellent zirconia, is formed by aerosol deposition on the lower surface (the side from which ink is ejected through the nozzles) of the metal nozzle plate 13a, in which nozzles 20 as through-holes have been formed (insulating ceramic layer formation step). Next, as shown in FIG. 20, a plate set 50a is formed by stacking five metal plates including the vibration plate 30, the cavity plate 10, the base plate 11, the manifold plate 12, and the nozzle plate 13a having the water repellent ceramic layer 13b formed on the lower surface thereof. Here, the water repellent ceramic layer 13b is incorporated into the plate set 50a such that this layer is the outermost surface of the plate set 50a. A plurality of (three here) plate sets 50a with this structure are prepared, and these sets are stacked as shown in FIG. 20. That is, a plurality of plate sets 50a are stacked such that the water repellent ceramic layer 13b formed on the lower surface of the nozzle plate 13 of the uppermost plate set 50a is in contact with the vibration plate 30 of the middle plate set 50a. The middle plate set 50a and the lowermost plate set 50a are similarly stacked (stacking step).

Pressure is simultaneously applied to all of the plate sets 50a through the upper and lower plates of the jig 51 while these sets are heated to about 1000° C., thereby diffusion bonding the five plates (the vibration plate 30, the cavity plate 10, the base plate 11, the manifold plate 12, and the nozzle plate 13a) belonging to each of the plate sets 50a (bonding step). Here, these plate sets 50a are not bonded to each other because they are stacked with the water repellent ceramic layer 13b sandwiched in between.

Figure 21:
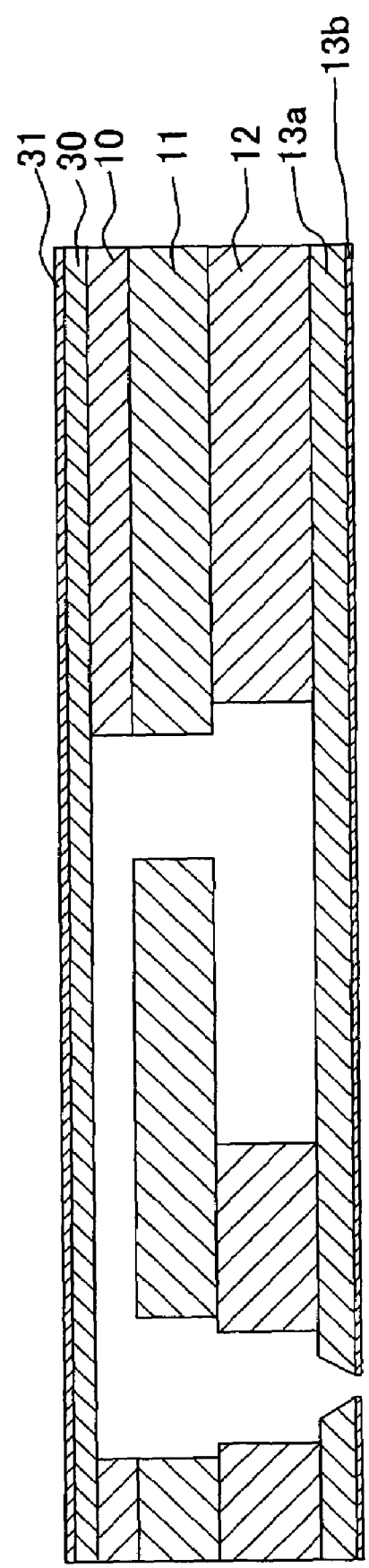
FIG. 21 is a diagram showing the step of forming an insulating ceramic layer 31 in the second embodiment.

Next, as shown in FIG. 21, the insulating ceramic layer 31 is formed on the top surface of the vibration plate 30 by aerosol deposition (AD), in which a powder of an insulating ceramic material is deposited by being sprayed toward a predetermined surface of the metal plate of each of the metal plate sets.

The subsequent steps, namely, the step of forming the individual electrodes 32, the wires 35, the terminals 36, and the connection terminals 40 on the surface of the insulating ceramic layer 31 (individual electrode formation step), the step of forming the piezoelectric layer 33 on the surfaces of the individual electrodes 32 by aerosol deposition (AD), sol-gel method, sputtering, or another such method (piezoelectric layer formation step), and the step of forming the common electrode 34 and the wire 41 over the entire surface of the piezoelectric layer 33 by screen printing, vapor deposition, sputtering, or another such method (common electrode formation step), are all the same as in the first embodiment. The ink-jet head 1 is manufactured by disposing the driver IC 37 on the insulating ceramic layer 31 and joining the connection terminals with the terminals of the driver IC 37 in the same manner as in the first embodiment.

In this embodiment, the metal nozzle plate 13a is also included in the plate set 50a, an advantage of which is that the metal members constructing the ink-jet head can be bonded in a single bonding step. When a metal nozzle plate 13a is used as in this embodiment, it is preferable to subject the surface of the nozzle plate to a water repellency treatment to prevent the ink from adhering thereto. Accordingly, in this embodiment, the water repellent ceramic layer 13b formed of water repellent zirconia is formed on the surface of the nozzle plate 13a, and diffusion bonding can be conducted according to the present invention via this layer. Here, the water repellent ceramic layer 13b and the insulating ceramic layer 31 may be formed by a method other than aerosol deposition (AD), such as sol-gel method or sputtering. Also, in this embodiment, the insulating ceramic layer 31 was formed on the top surface of the vibration plate 30 after the bonding step, but the insulating ceramic layer 31 may instead be formed on the top surface of the vibration plate 30 prior to the bonding step as in the first embodiment. In this case, the plate set 50a will have two ceramic layers: the water repellent ceramic layer 13b and the insulating ceramic layer 31. Consequently, in diffusion bonding there is no need to take into account the orientation at which the plate sets 50a come into contact with each other.

Third Embodiment

A third embodiment of the present invention will be described through reference to FIGS. 22A to 22C. In this embodiment, an ink-jet head is manufactured in the same manner as in the second embodiment, except that the piezoelectric layer is formed directly over the vibration plate, without any insulating ceramic layer being interposed.

Figure 20:
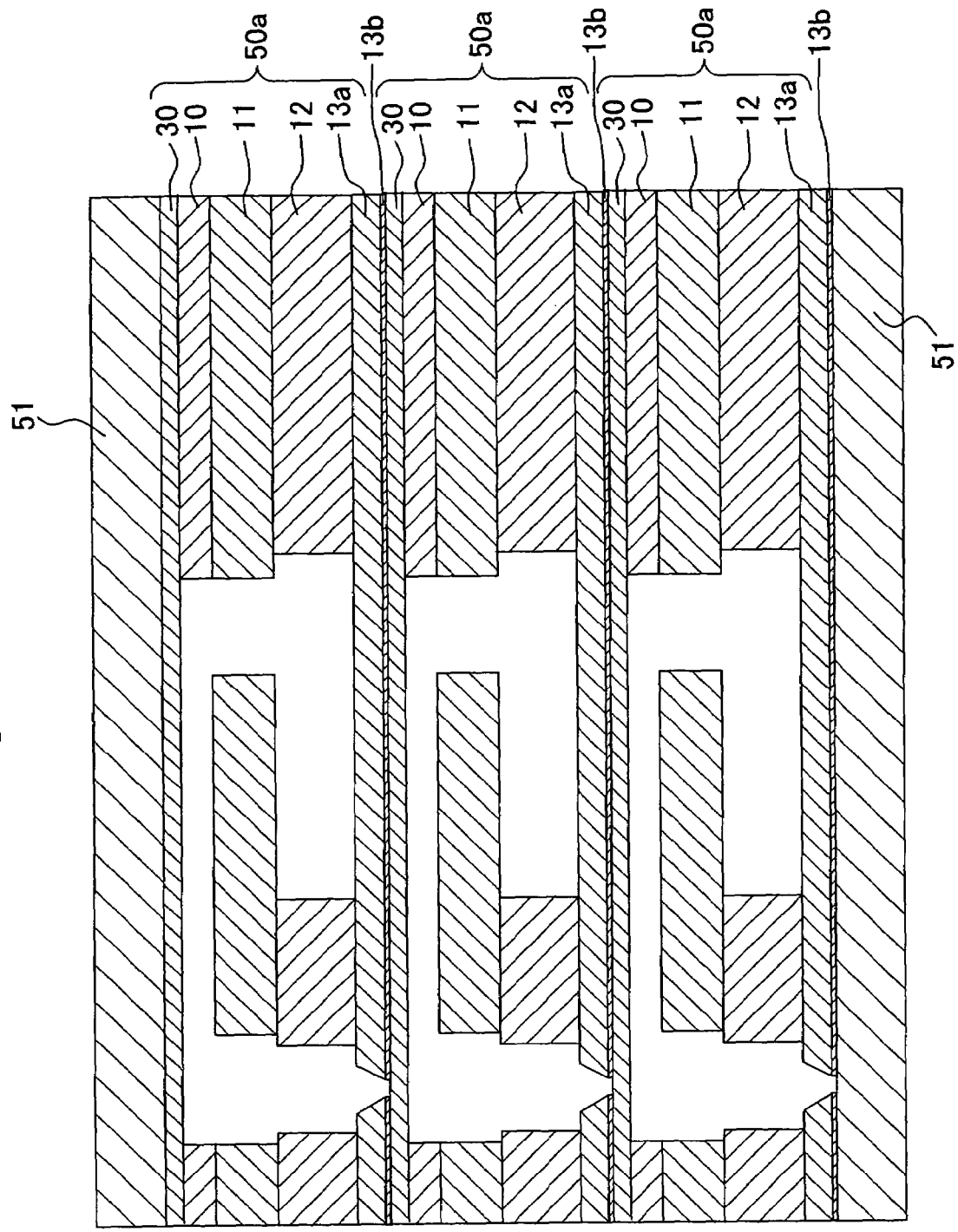
FIG. 20 is a diagram showing the stacking step and bonding step in the second embodiment.
Figure 22A:
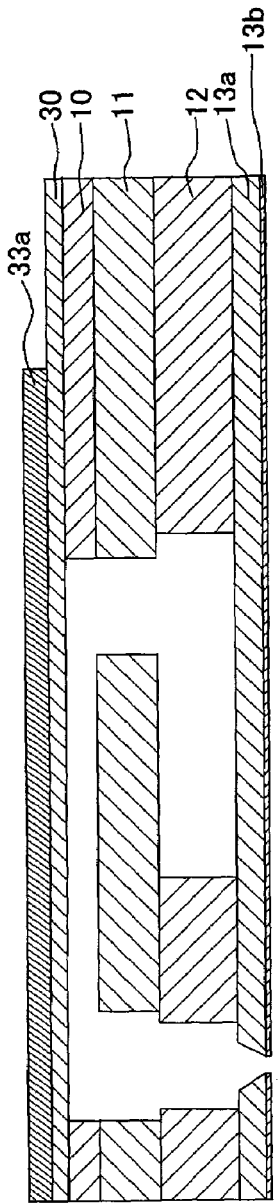
FIG. 22A is a diagram showing the step of forming a piezoelectric ceramic layer 33a on a vibration plate 30.
Figure 22B:
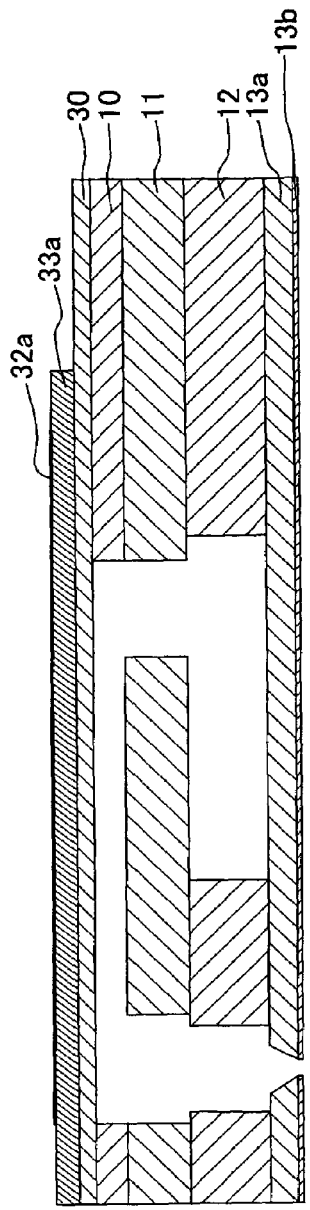
FIG. 22B is a diagram showing the step of forming an individual electrode 32a on the piezoelectric ceramic layer 33a, and FIG. 22C is a diagram showing the step of connecting the individual electrode 32a and a TAB tape 38.

Everything up to the bonding step shown in FIG. 20 is performed just as in the second embodiment, after which, as shown in FIG. 22A, a layer 33a of a piezoelectric ceramic (piezoelectric layer) whose main component is lead zirconate titanate (PZT) is formed on the top surface of the vibration plate 30 by aerosol deposition (AD), sol-gel method, or sputtering. Next, a heat treatment is performed at about 600° C. to promote the crystal growth of the PZT texture of the piezoelectric layer 33a. After this, individual electrodes 32a are formed by printing on the surface of the piezoelectric layer 33a shown in FIG. 22B (individual electrode formation step). Screen printing, vapor deposition, or sputtering can be employed as the printing method.

Figure 22C:
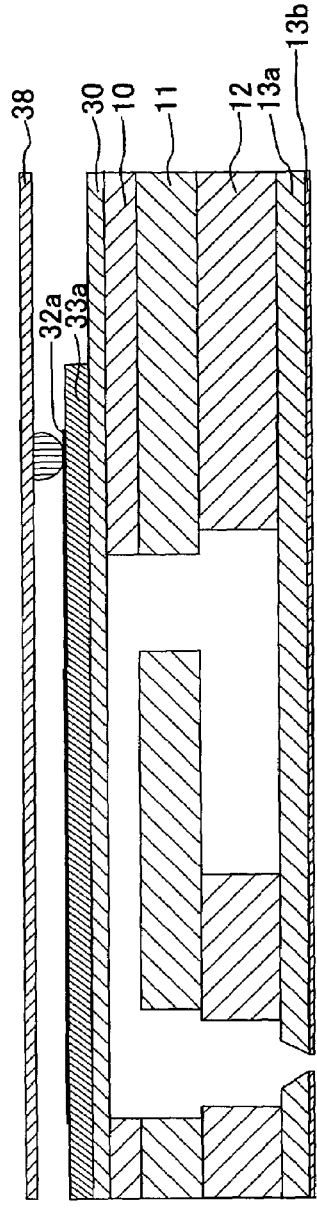

Next, as shown in FIG. 22C, an ink-jet head is manufactured by connecting the terminals of a driver IC (not shown) to the individual electrodes 32a formed on the piezoelectric layer 33a using a TAB (Tape Automated Bonding) tape 38. The TAB tape 38 is a tape carrier in which inner leads for connection to IC elements and outer leads for connection to the outside are provided at positions where IC elements are disposed, using photoetching or another such technique on a polyimide resin or other such flexible resin film. Such carriers are widely used in the mounting of semiconductor integrated circuits.

In this embodiment, the vibration plate 30 also serves as the common electrode, and is grounded through the driver IC (not shown) and the TAB tape 38. Accordingly, the step of forming the piezoelectric layer 33a over the vibration plate 30 also serves as the common electrode formation step.

Fourth Embodiment

A fourth embodiment of the present invention will be described through reference to FIGS. 23 to 25. In this embodiment, diffusion bonding is performed after stacking metal plate sets via a piezoelectric layer that serves as an insulating ceramic layer.

Figure 23:
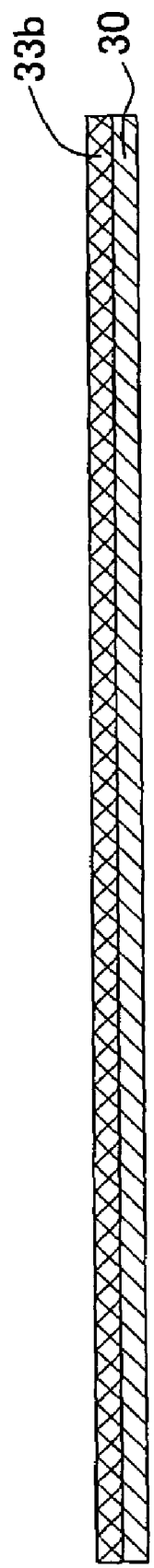
FIG. 23 is a diagram showing the step of forming a piezoelectric ceramic layer 33b on the vibration plate 30.
Figure 24:
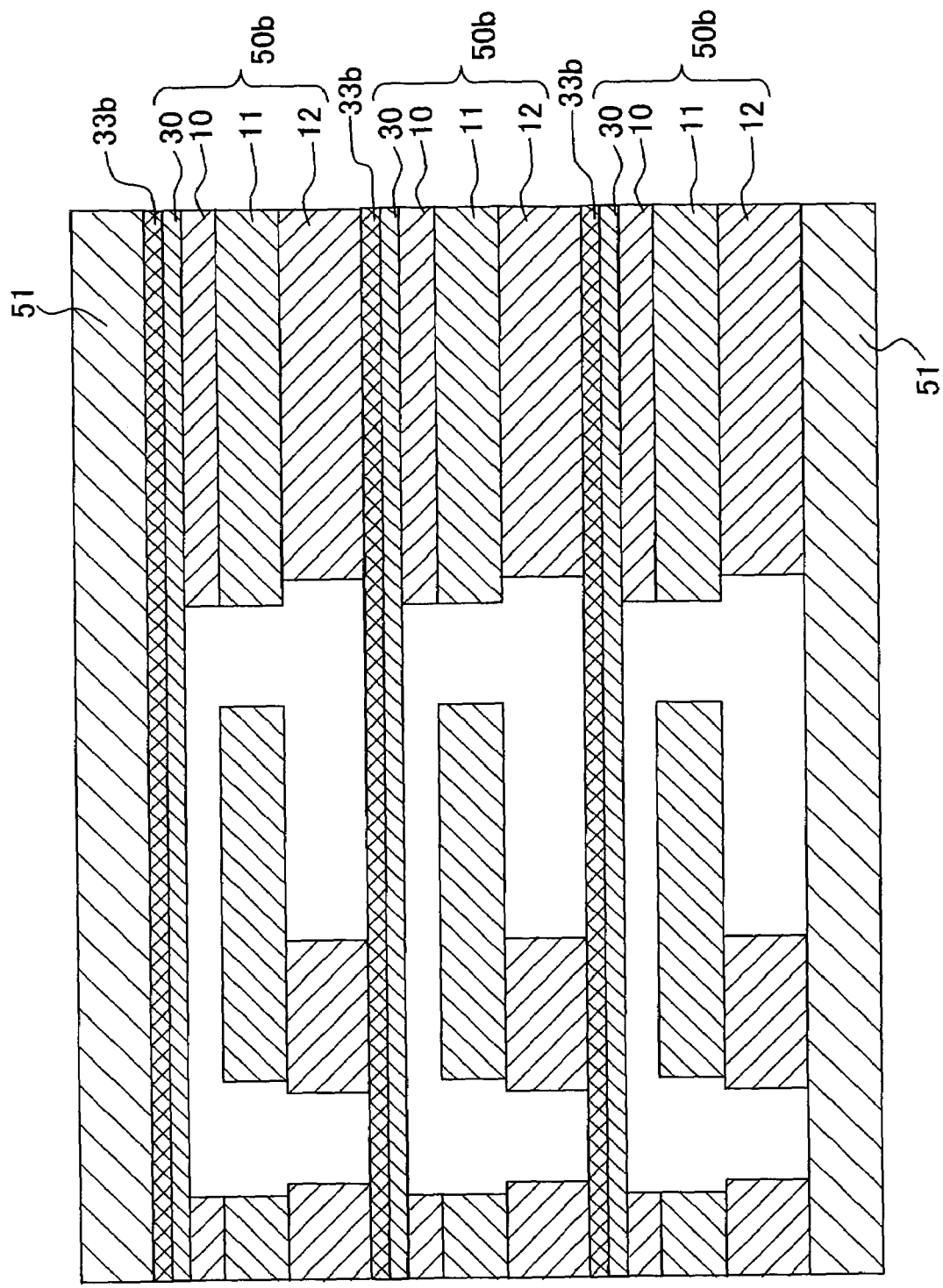
FIG. 24 is a diagram showing the stacking step and bonding step in a fourth embodiment.

First, as shown in FIG. 23, a piezoelectric layer 33b of a piezoelectric ceramic is formed on one side of the vibration plate 30 by aerosol deposition (AD), sol-gel method, or sputtering (insulating ceramic layer formation step). Then, as shown in FIG. 24, a plate set 50b is formed by stacking the cavity plate 10, the base plate 11, and the manifold plate 12 constructing a channel unit provided with holes for forming an ink channel, along with the vibration plate 30 such that the surface of the vibration plate 30 opposite to the surface having the piezoelectric layer 33b formed therein is in contact with the top surface of the cavity plate 10. A plurality of (three here) plate sets 50b with this structure are prepared, and these plate sets are stacked as shown in FIG. 24. That is, a plurality of plate sets 50b are stacked such that the lower surface of the manifold plate 12 of the uppermost plate set 50b is in contact with the piezoelectric layer 33b formed on the top surface of the vibration plate 30 of the middle plate set 50b. The middle plate set 50b and the lowermost plate set 50b are similarly stacked. The plurality of plate sets 50b thus stacked are sandwiched between the upper and lower plates of the jig 51 (stacking step).

Pressure is applied to the plate sets 50 through the jig 51 while these sets are heated to about 1000° C., thereby diffusion bonding the four plates (the cavity plate 10, the base plate 11, the manifold plate 12, and the vibration plate 30) belonging to each of the plate sets 50 (bonding step). The piezoelectric layer 33b formed on the top surface of the vibration plate 30 is sintered and then annealed by the heating performed during diffusion bonding.

Figure 25:
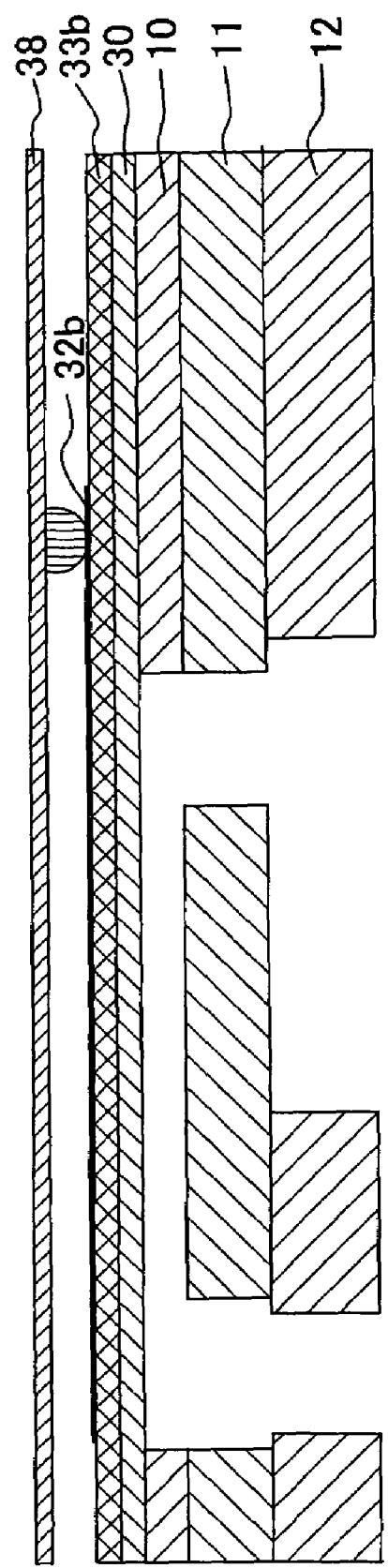
FIG. 25 is a diagram showing the step of connecting an individual electrode 32b and the TAB tape 38 in the fourth embodiment.

Next, as shown in FIG. 25, individual electrodes 32b are formed on the surface of the piezoelectric layer 33b by screen printing, vapor deposition, or sputtering (individual electrode formation step), and the terminals of a driver IC (not shown) are connected to the individual electrodes 32b formed on the piezoelectric layer 33b using the TAB tape 38. The nozzle plate 13 is then bonded to the lower surface of the manifold plate 12 in the same manner as in the first embodiment.

In this embodiment, the vibration plate 30 also serves as the common electrode, so the step of forming the piezoelectric layer 33b over the vibration plate 30 also serves as the common electrode formation step. Also, in the bonding step, the piezoelectric layer 33b has the function of preventing diffusion bonding between different plate sets. In particular, with the process in this embodiment, the heat involved in diffusion bonding is utilized to perform the sintering and annealing required in the formation of the piezoelectric layer 33b, so there is no need for sintering and annealing steps to be performed separately. This shortens the overall time entailed by the process and also saves energy. Also, the nozzle plate 13 was bonded to the lower surface of the manifold plate 12 at the very end in this embodiment, but the metal nozzle plate 13a may instead be bonded to the lower surface of the manifold plate 12 by diffusion bonding as was done in the second and third embodiments. Furthermore, a water repellent ceramic layer formed of, for example, water repellent zirconia may be formed on the surface of this nozzle plate 13a.

Fifth Embodiment

Figure 12:
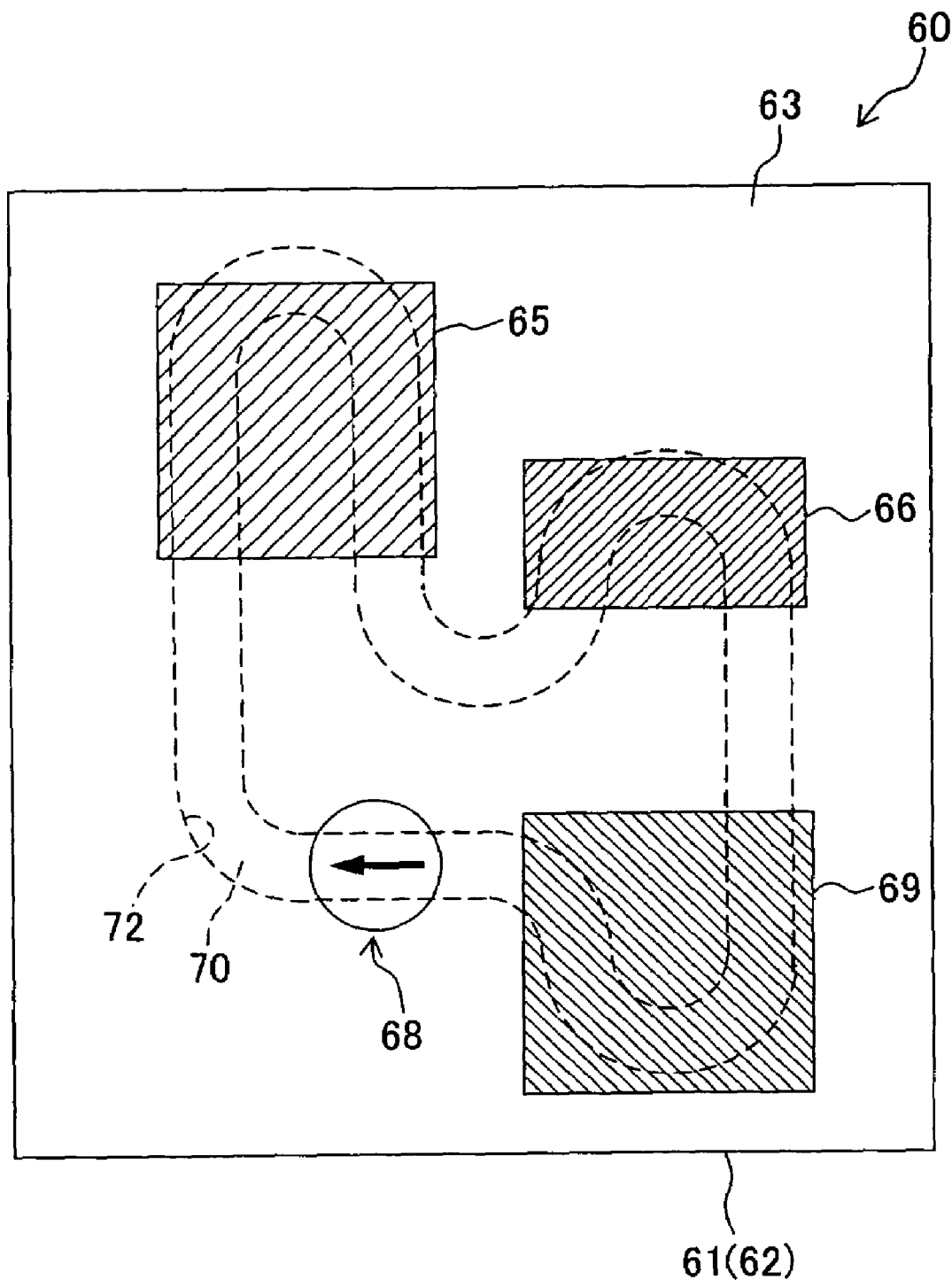
FIG. 12 is a schematic plan view of the metal substrate pertaining to a second embodiment of the present invention.
Figure 13:
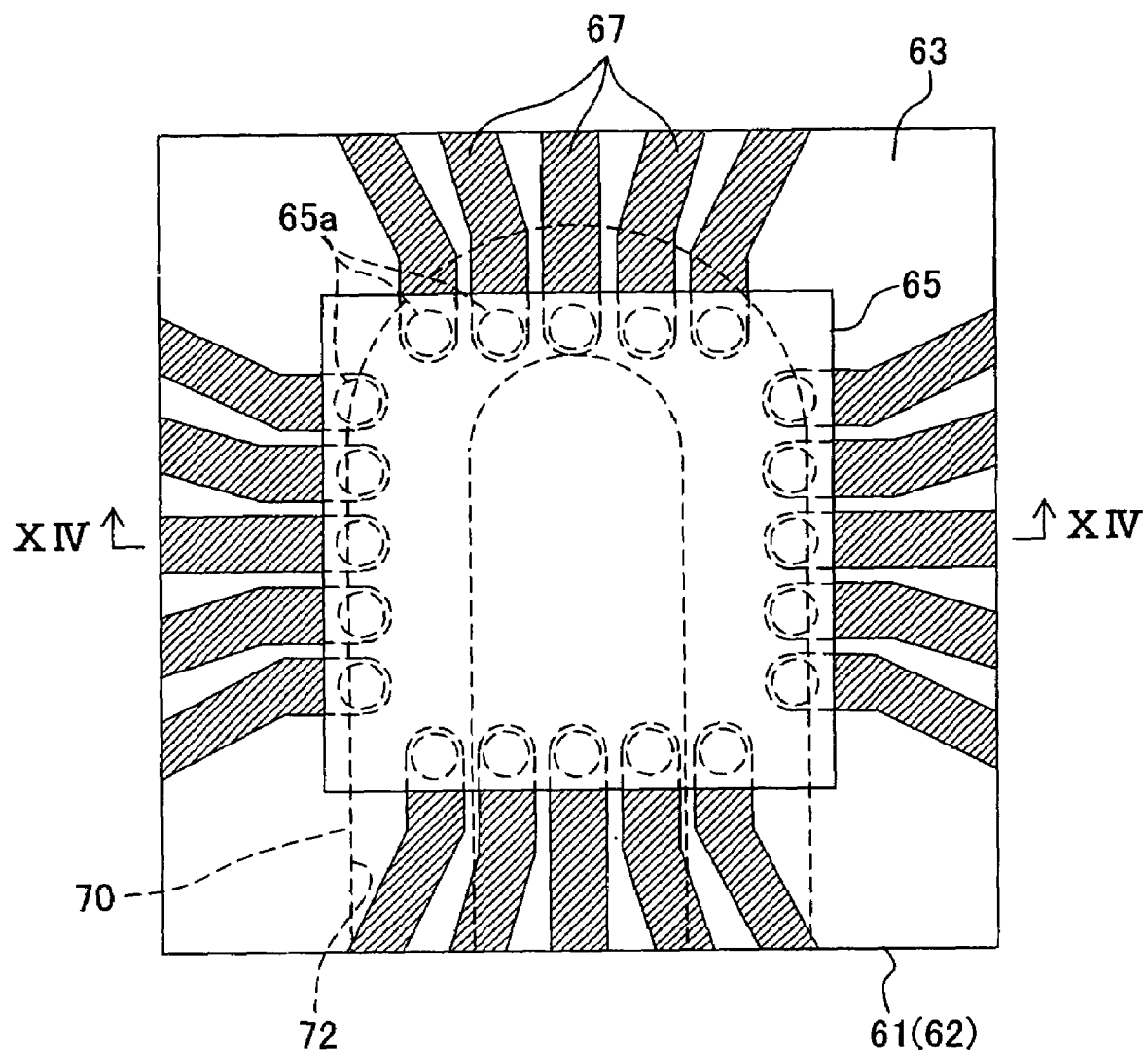
FIG. 13 is an enlarged view of the area around the IC in FIG. 12.
Figure 14:
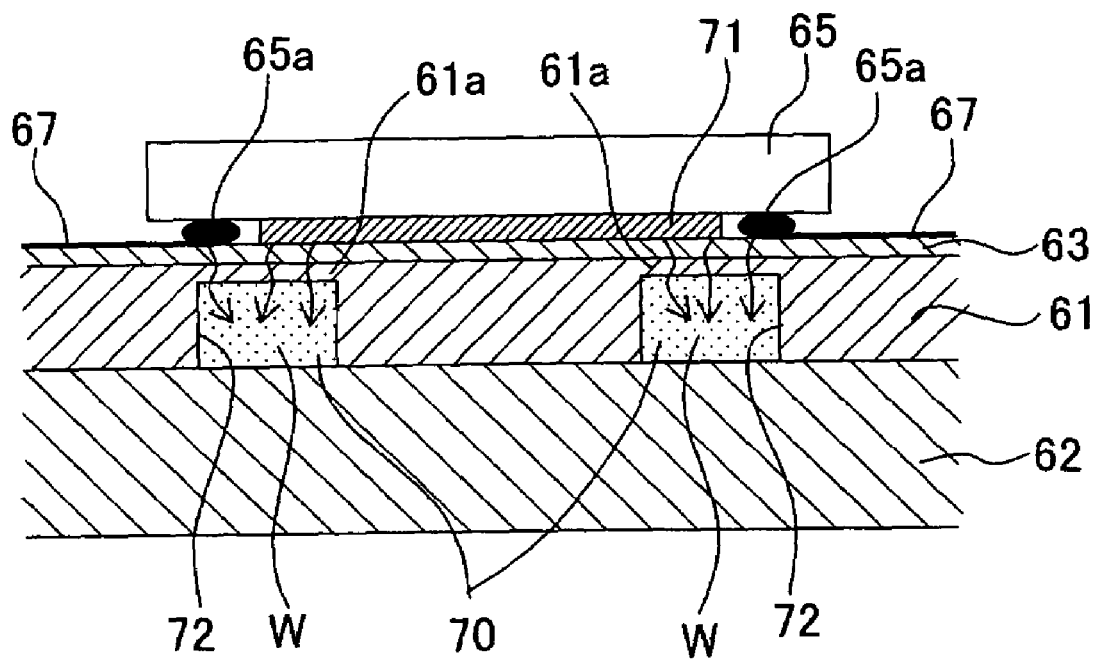
FIG. 14 is a cross section taken along the XIV-XIV line in FIG. 13.

A fifth embodiment of the present invention will now be described through reference to FIGS. 12 to 17. This fifth embodiment is an example of applying the present invention to the manufacture of a metal substrate on which electronic components used in electronic devices such as portable or mobile telephones and personal computers may be mounted. The structure disclosed in FIGS. 12 to 17 is the structure disclosed in a U.S. Patent Application entitled "SUBSTRATE MOUNTED WITH ELECTRONIC ELEMENT THEREON AND LIQUID EJECTION HEAD INCLUDING THE SUBSTRATE" which was filed by the applicant of the present invention on Jul. 25, 2005, claiming the priority of Japanese Patent Application No. 2004-220202 filed on Jul. 28, 2004; the inventor of the U.S. patent application being Hiroto SUGAHARA; and serial number having not been assigned to the U.S. patent application. FIG. 12 is an overhead plan view showing a top surface of a metal substrate. As shown in FIGS. 12 to 14, a metal substrate 60 (hereinafter referred to simply as the substrate 60) has two metal plates 61 and 62 as base materials, and an insulating ceramic layer 63 formed on the top surface of the upper plate 61.

The two plates 61 and 62 are formed of a metal material with a high thermal conductivity, such as stainless steel, iron, copper, nickel, or aluminum. The insulating ceramic layer 63 formed of a ceramic material with a high insulating resistance is formed on the top surface of the upper plate 61. As discussed below, this insulating ceramic layer 63 is formed in order to diffusion bond a plurality of plate sets 80 each including two plates 61 and 62, but the insulating ceramic layer 63 also has the function of electrically insulating the metal plate 61 from wiring 67 connected to an electronic components 65 mounted on the surface of the insulating ceramic layer 63. Furthermore, the insulating ceramic layer 63 is formed of a ceramic material with high thermal conductivity so that the heat generated by the electronic components (such as ICs 65 and 66) will be readily transferred to the plate 61. Table 2 lists examples of usable ceramic materials. Among these materials, it is preferable to use alumina, silica, yttria, silicon nitride, aluminum nitride, or the like because of their particularly high thermal conductivity. This insulating ceramic layer 63 can be easily formed by AD. In addition, sol-gel method, sputtering, or CVD (chemical vapor deposition) can be used.

TABLE 2

| Ceramic material | Thermal conductivity (W/(m · K)) |
|---|---|
| alumina | 30 |
| zirconia | 3 |
| silica | 10 |
| mullite | 5 |
| cordierite | 4 |
| steatite | 2 |
| forsterite | 5 |
| yttria | 14 |
| silicon nitride | 30 |
| aluminum nitride | 150 |

The epoxy resin used in glass epoxy substrates that are widely used as mounting substrates for electronic components (in which the surface of a glass cloth is impregnated with an epoxy resin as an insulating material) has a thermal conductivity of 0.19 W/m·K, so the thermal conductivity of the ceramic materials listed in Table 2 is far higher the epoxy resin.

The ICs 65 and 66, resistors (not shown), capacitors (not shown), and many other electronic components are mounted on the top surface of the insulating ceramic layer 63. Further, as shown in FIG. 13, a plurality of wires 67, which connect the electronic components together by being joined to the terminals of the ICs 65 and 66 and other electronic components (such as the terminals 65a), are also formed on the top surface of the insulating ceramic layer 63. The wires 67 are electrically insulated from the metal plate 61 and other adjacent wires 67 by the insulating ceramic layer 63, which prevents short circuiting.

As discussed above, the insulating ceramic layer 63 is made of a ceramic material with a high thermal conductivity, so as indicated by the arrows in FIG. 14, the majority of the heat generated by the IC 65 is transferred from the insulating ceramic layer 63, through the terminals 65a, to the metal plate 61, and the heat is then transferred through this plate 61 to a location away from the IC 65. Ceramic materials are generally more expensive than metal materials, and the thermal conductivity of a ceramic material is often lower than that of a metal material. Accordingly, in order to obtain a substrate that is inexpensive and has good heat dissipation efficiency, it is preferable that the insulating ceramic layer 63 formed of a ceramic material is sufficiently thinner than the metal plate. Also, as shown in FIG. 14, a material 71 with high thermal conductivity such as a metal paste, metal film or the like may be interposed between the insulating ceramic layer 63 and the IC 65 so that the contact surface area between the insulating ceramic layer 63 and the IC 65 will be increased and the heat generated by the IC 65 will be transferred more easily to the insulating ceramic layer 63.

As shown in FIGS. 12 to 14, a groove 72 is formed on the lower surface of the upper plate 61. This groove 72 is closed by the lower plate 62, forming a closed loop channel 70 (liquid channel) in the inside of the two plates 61 and 62. This channel 70 is filled with water W, and this water W is pressurized by a pressurizing mechanism 68 (such as an actuator pump) and circulates through the closed loop channel 70. As shown in FIG. 12, this channel 70 is formed so as to pass through the area in which the ICs 65 and 66 are disposed and generate a large quantity of heat, and an area in which a heat dissipater 69 is disposed. The channel 70 is formed with a rectangular cross section in the inside of the two plates 61 and 62, and a thin portion 61a of the upper plate 61 is interposed between the insulating ceramic layer 63 and the channel 70. Thus, in the portion where the channel 70 is formed, a metal material layer (the thin portion 61a) with high strength is present on the lower side of the insulating ceramic layer 63 formed of a ceramic material that has lower strength than the metal plates 61 and 62, thereby minimizing the decrease in strength of the substrate 60 in the portion where the channel 70 is formed.

The heat generated by the ICs 65 and 66 is transferred, via the metal plates 61 and 62 and the insulating ceramic layer 63 with high thermal conductivity, to the water W in the channel 70, and the water W is pressurized by the pressurizing mechanism 68, so that the heat is dissipated to the outside via the plates 61 and 62 while the water circulates through the channel 70. The heat dissipater 69 is provided at a position along the channel 70, away from the ICs 65 and 66, so the heat transferred from this heat dissipater 69 to the water W is effectively diffused to the outside.

Figure 15:
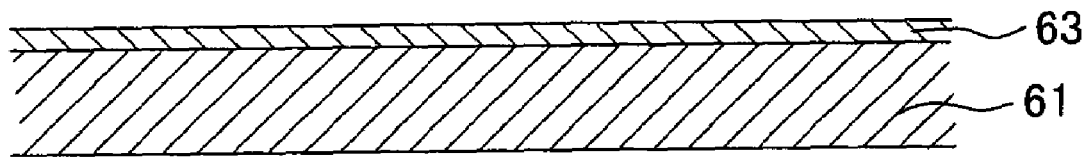
FIG. 15 is a diagram showing the step of forming an insulating ceramic layer on a plate (first step)

The method for manufacturing the substrate 60 will now be described. As shown in FIG. 15, first, the insulating ceramic layer 63 is formed on one surface of the plate 61 (first step). Here, the insulating ceramic layer 63 can be formed easily by using aerosol deposition (AD), in which a powder of an insulating ceramic material is deposited by being sprayed toward a predetermined surface of the plate 61. The insulating ceramic layer 63 may also be formed by sol-gel method, sputtering, or the like.

Figure 16:
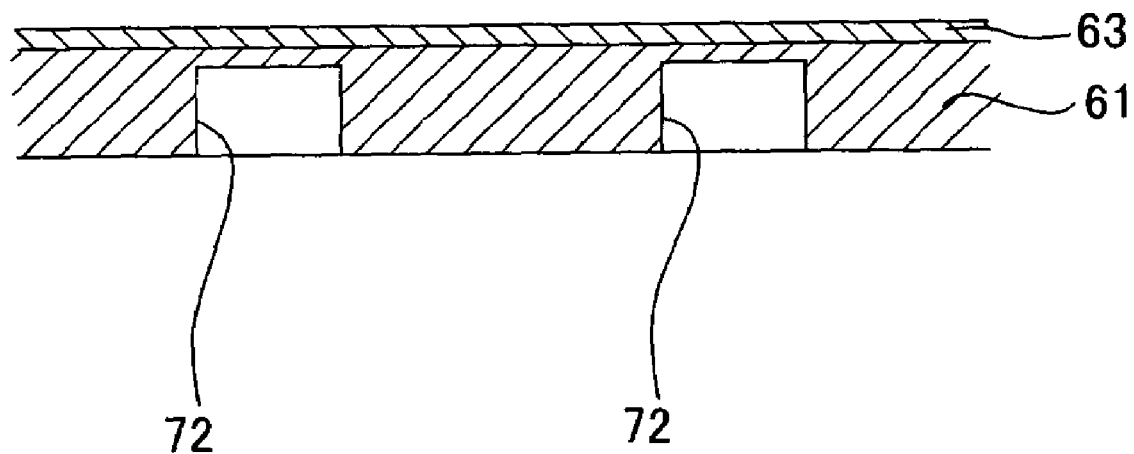
FIG. 16 is a diagram showing the step of forming a groove in the plate.

Then, as shown in FIG. 16, the groove 72 through which the water W is flown is formed on the side of the plate 61 opposite to the side thereof having the insulating ceramic layer 63 formed therein. This groove 72 can be easily formed, for example, by subjecting the metal plate 61 to half etching.

Figure 17:
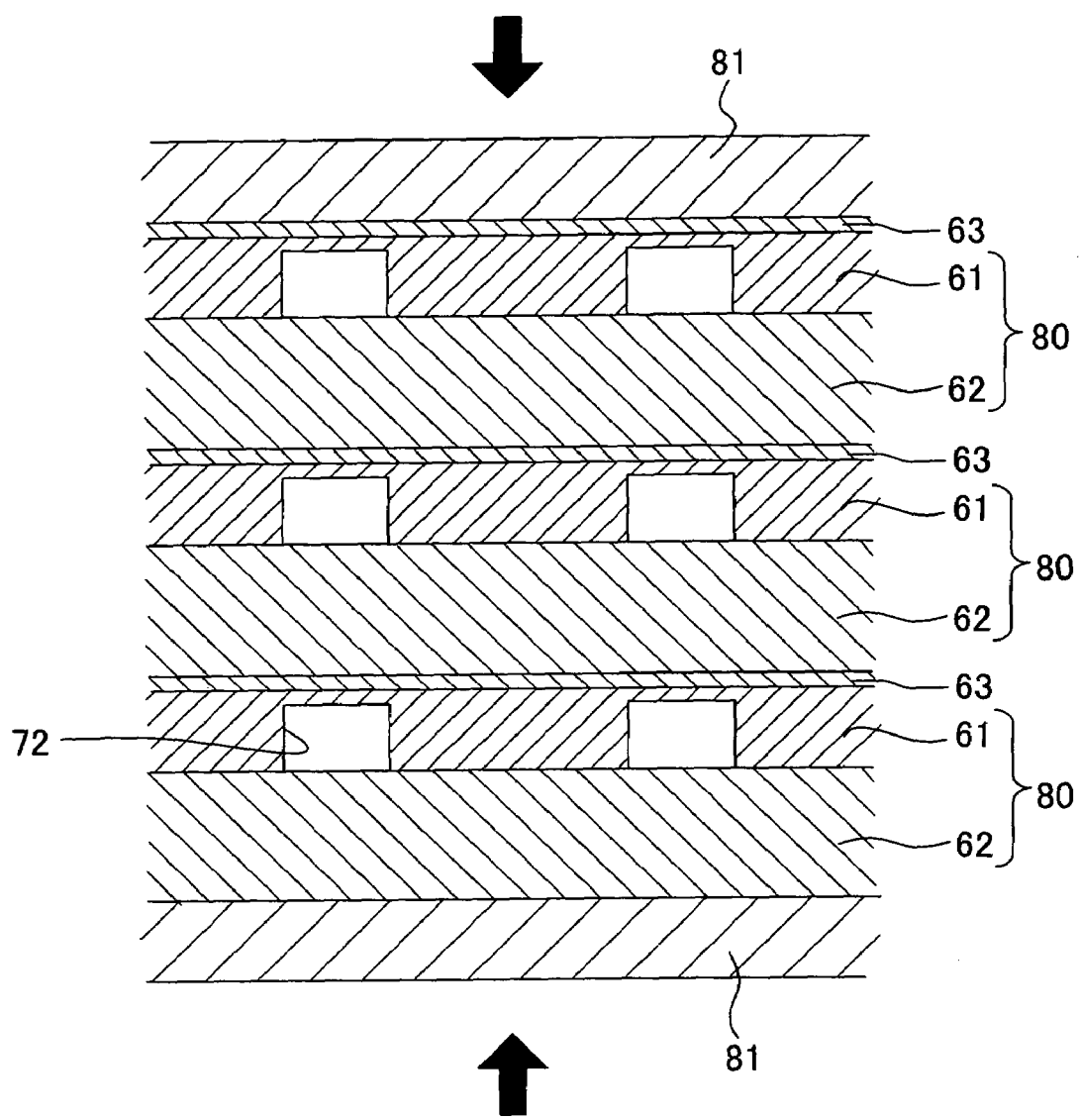
FIG. 17 is a diagram showing the steps of bonding a plurality of plate sets (second and third steps)

As shown in FIG. 17, the two plates 61 and 62 are stacked, a plurality of (such as three) plate sets 80 each including these two plates 61 and 62 are stacked with the insulating ceramic layer 63 interposed therebetween, and the plate 62 of a certain plate set 80 is stacked on the surface of the insulating ceramic layer 63 formed on the plate 61 belonging to another of the plate sets 80 (second step).

The plurality of plate sets 80 thus stacked are sandwiched in a jig 81 including a pair of upper and lower plates, and are heated to about 1000° C. while being pressed via the jig 81, thereby diffusion bonding the two plates 61 and 62 belonging to each of the plurality of plate sets 80 (third step). Since the insulating ceramic layer 63 is thus interposed between the plurality of plate sets 80, the two plates 61 and 62 belonging to different plate sets 80 will not be bonded. A plurality of wires 67 are formed on the surface of the insulating ceramic layer 63 for each of the plurality of bonded plate sets 80, and electronic components such as the ICs 65 and 66 are connected to these wires 67.

The method for manufacturing the metal substrate 60 described above has the following effects. Because a plurality of plate sets 80 each including the two metal plates 61 and 62 are stacked via the insulating ceramic layer 63 formed on a plate of each of the plate sets, and then all of these plate sets 80 undergo diffusion bonding together, a plurality of laminates each including the two plates 61 and 62 can be manufactured at the same time, which shortens the manufacturing process. Also, since the two plates 61 and 62 respectively belonging to two different plate sets 80 are stacked with the insulating ceramic layer 63 interposed in between, the insulating ceramic layer 63 prevents these two plates 61 and 62 from being diffusion bonded. Furthermore, the insulating ceramic layer 63 can insulate the wires 67 from the substrate 60 when these wires 67 are formed on the surface of the insulating ceramic layer 63 formed for diffusion bonding the plurality of plate sets 80 all at once.

Figure 18:
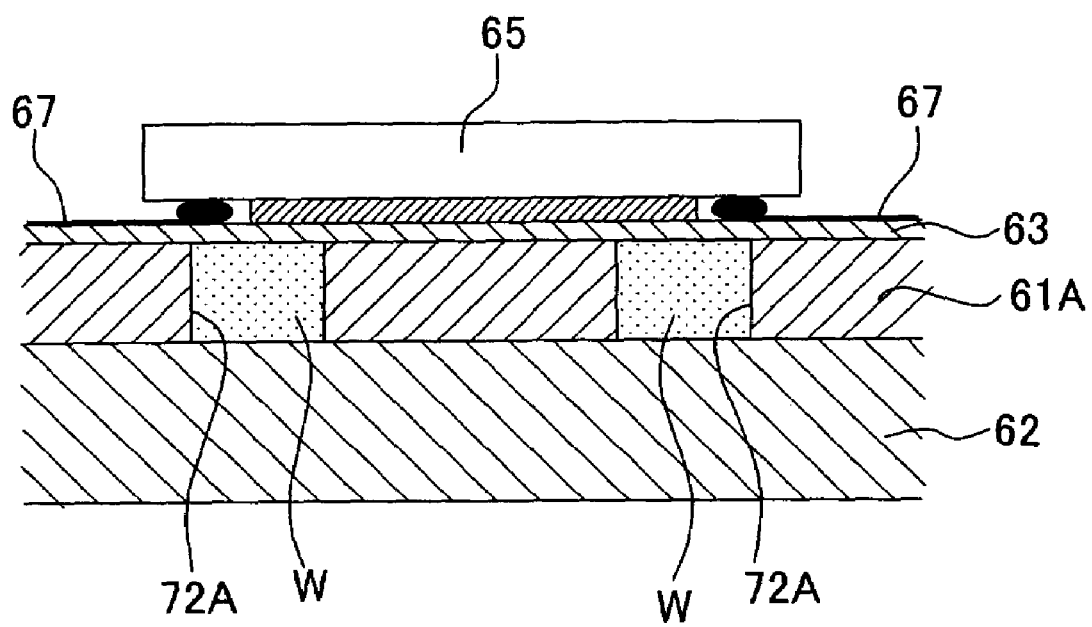
FIG. 18 is a cross section corresponding to FIG. 14, but pertaining to a modification of the fifth embodiment.

In the method for manufacturing the substrate 60 in the fifth embodiment described above, the channel 70 through which water flowed is formed in the substrate 60 by forming the groove 72 in the plates 61 and 62. However, as shown in FIG. 18, a through hole 72A may be formed in an upper plate 61A, and a channel through which the water W flows may be formed by this hole 72A. In this case, the water W in the channel will be in direct contact with the insulating ceramic layer, so heat generated by the IC 65 will be even more efficiently transferred to the fluid. This through hole 72A can also be easily formed by subjecting the plate 61A to full etching.

The embodiments of applying the present invention to an ink-jet head (the first to fourth embodiments) and to a metal substrate (the fifth embodiment) were described above, but the present invention is not limited to these first to fifth embodiments. Specifically, the present invention can be applied to a laminates in a variety of configurations obtained by the diffusion bonding of a plurality of stacked metal plates.

What is claimed is:

1. A method for manufacturing a plurality of ink-jet heads each head including a channel unit having a laminate of a plurality of metal plates, the laminate forming an ink channel including a plurality of pressure chambers communicating with nozzles, and a piezoelectric actuator which varies a volume of the pressure chambers, the method comprising:

a step of providing a plurality of metal plate sets each of which includes the plurality of metal plates forming the laminate;

an insulating ceramic layer-formation step of forming an insulating ceramic layer at least on one of outermost metal plates of at least one set of the metal plate sets, the outermost metal plates forming outermost layers of the laminate;

a stacking step of stacking the plurality of metal plate sets via the insulating ceramic layer of the at least one set; and a bonding step of heating the stacked plurality of metal plate sets and simultaneously diffusion bonding the plurality of metal plates belonging to each of the plurality of metal plate sets.

2. The method for manufacturing the plurality of ink-jet heads according to claim 1, wherein, in the bonding step, the plurality of metal plates are simultaneously diffusion bonded except for two metal plates stacked via the insulating ceramic layer.

3. The method for manufacturing ink-jet heads according to claim 2, further comprising:

an individual electrode formation step of forming a plurality of individual electrodes on a side of the insulating ceramic layer opposite to the pressure chambers at positions facing each of the plurality of pressure chambers;

a piezoelectric layer-formation step of forming a piezoelectric layer on the side of the insulating ceramic layer on which the individual electrodes are formed; and a common electrode-formation step of forming a common electrode on a side of the piezoelectric layer opposite to the individual electrodes.

4. The method for manufacturing ink-jet heads according to claim 1, wherein one of the outermost metal plates is a vibration plate which covers the pressure chambers, and each of the ink-jet heads has a piezoelectric layer disposed on a side of the vibration plate opposite to the pressure chambers.

5. The method for manufacturing ink-jet heads according to claim 4, wherein the vibration plate is a common electrode.

6. The method for manufacturing ink-jet heads according to claim 1, wherein one of the outermost metal plates is a nozzle plate.

7. The method for manufacturing ink-jet heads according to claim 6, wherein the other of the outermost metal plates is a vibration plate, and the bonding step is followed by a step of forming an insulating ceramic layer by one of aerosol deposition, sol-gel method, and sputtering on one surface of the vibration plate.

8. The method for manufacturing ink-jet heads according to claim 1, wherein the outermost metal plates are a vibration plate and a nozzle plate.

9. The method for manufacturing ink-jet heads according to claim 1, wherein the insulating ceramic layer is formed of alumina or zirconia.

10. The method for manufacturing ink-jet heads according to claim 1, wherein the piezoelectric actuator has a piezoelectric layer, and the insulating ceramic layer is the piezoelectric layer.

11. The method for manufacturing ink-jet heads according to claim 1, wherein the insulating ceramic layer is a piezoelectric layer, and the piezoelectric layer is subjected to at least one of sintering and annealing in the bonding step.

* * * * *